(12) United States Patent
Lee et al.

(10) Patent No.: US 8,306,177 B2
(45) Date of Patent: Nov. 6, 2012

(54) METHOD OF DRIVING A GATE LINE AND GATE DRIVE CIRCUIT FOR PERFORMING THE METHOD

(75) Inventors: Hong-Woo Lee, Cheonan-si (KR);
Sung-Man Kim, Seoul (KR);
Jong-Hyuk Lee, Seoul (KR);
Jong-Hwan Lee, Anyang-si (KR);
Hyeon-Hwan Kim, Cheonan-si (KR);
Sang-Moon Moh, Hwaseong-si (KR);
Jeong-Il Kim, Asan-si (KR); Yeon-Kyu Moon, Gunpo-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 449 days.

(21) Appl. No.: 12/575,895

(22) Filed: Oct. 8, 2009

(65) Prior Publication Data

US 2010/0158188 A1    Jun. 24, 2010

(30) Foreign Application Priority Data

Dec. 23, 2008  (KR) .................. 10-2008-0131926

(51) Int. Cl.
*G11C 19/00* (2006.01)
(52) U.S. Cl. ................ 377/64; 377/69; 377/79
(58) Field of Classification Search ............... None
See application file for complete search history.

(56) References Cited

U.S. PATENT DOCUMENTS

| | | | | |
|---|---|---|---|---|
| 7,724,864 | B2 * | 5/2010 | Kim et al. | 377/64 |
| 7,911,436 | B2 * | 3/2011 | Lee et al. | 345/100 |
| 7,949,086 | B2 * | 5/2011 | Tsai et al. | 377/64 |
| 8,098,792 | B2 * | 1/2012 | Hsu et al. | 377/64 |
| 2006/0017686 | A1 * | 1/2006 | Park | 345/100 |
| 2006/0056267 | A1 * | 3/2006 | Kim et al. | 365/230.06 |
| 2006/0146978 | A1 * | 7/2006 | Jang | 377/64 |
| 2007/0296681 | A1 * | 12/2007 | Kim et al. | 345/100 |
| 2008/0001904 | A1 * | 1/2008 | Kim et al. | 345/100 |
| 2008/0101529 | A1 * | 5/2008 | Tobita | 377/64 |
| 2009/0058790 | A1 * | 3/2009 | Chiang et al. | 345/100 |

(Continued)

FOREIGN PATENT DOCUMENTS

| | | |
|---|---|---|
| JP | 2005-037842 | 2/2005 |
| KR | 1020070043079 | 4/2007 |
| KR | 1020070073634 | 7/2007 |
| KR | 1020080039026 | 5/2008 |

OTHER PUBLICATIONS

English Abstract for Publication No. 2005-037842.

(Continued)

*Primary Examiner* — Tuan T Lam
(74) *Attorney, Agent, or Firm* — F. Chau & Associates, LLC

(57) ABSTRACT

A pull-up driving part maintains a signal of a first node at a high level by receiving a turn-on voltage in response to one of a previous stage or a vertical start signal. A pull-up part outputs a clock signal through an output terminal in response to the signal of the first node. A first holding part maintains a signal of a second node at a high level or a low level when the signal of the first node is respectively low or high. A second holding part maintains the signal of the first node and a signal of the output terminal at a ground voltage in response to the signal of the second node or a delayed and inverted clock signal.

22 Claims, 10 Drawing Sheets

U.S. PATENT DOCUMENTS

| | | | |
|---|---|---|---|
| 2009/0304138 A1* | 12/2009 | Tsai et al. | 377/79 |
| 2010/0007598 A1* | 1/2010 | Chan et al. | 345/100 |
| 2010/0039363 A1* | 2/2010 | Lee et al. | 345/100 |
| 2010/0150301 A1* | 6/2010 | Chan et al. | 377/64 |
| 2011/0044423 A1* | 2/2011 | Lin et al. | 377/64 |

OTHER PUBLICATIONS

English Abstract for Publication No. 1020070043079.
English Abstract for Publication No. 1020070073634.
English Abstract for Publication No. 1020080039026.

\* cited by examiner

METHOD OF DRIVING A GATE LINE AND GATE DRIVE CIRCUIT FOR PERFORMING THE METHOD

CROSS-REFERENCE TO RELATED APPLICATION

This application claims priority under 35 U.S.C. §119 to Korean Patent Application No. 2008-131926, filed on Dec. 23, 2008 in the Korean Intellectual Property Office (KIPO), the contents of which are herein incorporated by reference in their entirety.

BACKGROUND OF THE INVENTION

1. Field of the Invention

Exemplary embodiments of the present invention relate to a method of driving a gate line and a gate drive circuit for performing the method. More particularly, exemplary embodiments of the present invention relate to a method of driving a gate line having improved driving reliability, and a gate drive circuit for performing the method.

2. Description of Related Art

Display devices include a gate drive circuit and a switching device for generating images. To reduce manufacturing costs and the total size of a panel module for a display device, an amorphous silicon gate (ASG) technology has been applied that includes simultaneously forming the gate drive circuit in a peripheral area of a panel, and the switching device disposed in a display area of a panel.

Since the ASG technology includes selectively outputting a clock signal in which a phase is continuously changing to generate a gate signal, noise is generated by the clock signal even when not driving. Accordingly, to minimize the noise generated when not driving, various structures have been proposed.

However, no known ASG structure has effectively controlled noise generated when the temperature of a gate drive part becomes high due to being driven for a long time. Since the noise of the gate signal reduces display quality as a result, a need exists for a method of driving a gate line having improved driving reliability, and a gate drive circuit for performing the method.

SUMMARY OF THE INVENTION

According to an exemplary embodiment of the present invention, a method of driving a gate line of a device including a shift register including three or more stages connected in series including maintaining, at a stage, a first node signal at a high level by receiving a turn-on voltage in response to one of a previous stage or a vertical start signal, outputting a clock signal as a gate signal provided to the gate line in response to the first node signal in a high state, maintaining a second node signal at a high level or at a low level when the first node signal is respectively low or high, during a period in which a delayed signal from the clock signal is high, maintaining the first node signal and the gate signal at a ground voltage in response to the second node signal or the delayed signal from the clock signal, and maintaining the gate signal at the ground voltage in response to one of a next stage or the vertical start signal.

In an example embodiment of the present invention, the first node signal may be boosted up from the first high level to a second high level that is higher than the first high level in response to the gate signal when the gate signal is outputted.

According to another exemplary embodiment of the present invention, a gate drive circuit includes a shift register formed as a plurality of stages connected in series, the gate drive circuit sequentially activating a plurality of gate lines. A present stage includes a pull-up driving part, a pull-up part, a first holding part, and a second holding part. The pull-up driving part maintains a signal of a first node at a high level by receiving a turn-on voltage in response to one of a previous stage in the series or a vertical start signal. The pull-up part outputs a clock signal of a first clock terminal through an output terminal in response to the signal of the first node. The first holding part maintains a signal of a second node at a high level in response to a low level of the signal of the first node, and maintains the signal of the second node at a low level in response to a high level of the signal of the first node, during a period in which a delayed signal of the clock signal is high. The second holding part maintains the signal of the first node and a signal of the output terminal at a ground voltage in response to the signal of the second node or a signal that is an inverted signal of the delayed signal of the clock signal.

In an exemplary embodiment of the present invention, the present stage may further include a pull-down part outputting the ground voltage through the output terminal in response to one of a next stage in the series, or the vertical start signal.

In an exemplary embodiment of the present invention, the pull-up driving part may include a buffer part receiving the turn-on voltage to provide the first node with a first high level signal in response to the one of the previous stage or the vertical start signal, and a charging part boosting the first high level signal to a second high level signal in synchronization with the signal of the output terminal.

In an exemplary embodiment of the present invention, the first holding part may include a first transistor including a drain and a gate, each of the drain and the gate connected to a third clock terminal to receive a delayed first clock signal, a second transistor including a drain connected to a source of the first transistor, a gate connected to the first node, and a source receiving the ground voltage, a third transistor including a drain connected to the third clock terminal, a gate connected to a source of the first transistor, a fourth transistor including a drain connected to a source of the third transistor forming the second node, and a gate connected to the gate of the second transistor and connected to the first node, and a source receiving the ground voltage, a first capacitor being connected between the drain of the third transistor and the gate of the third transistor, and a second capacitor being connected between the gate of the third transistor and the source of the third transistor.

In an exemplary embodiment of the present invention, the fourth transistor may maintain the signal of the second node at a low level when a signal of the third clock terminal is high and the signal of the first node is high.

In an exemplary embodiment of the present invention, the second holding part may include a fifth transistor including a drain connected to the first node, a gate connected to the second node, and a source receiving the ground voltage, a sixth transistor including a drain connected to the output terminal, a gate connected to the second node, and a source receiving the ground voltage, a seventh transistor including a drain connected to a first input terminal, a gate connected to a second clock terminal to receive the inverted signal of the delayed signal of the clock signal, and a source connected to the first node, and an eighth transistor including a drain connected to the output terminal, a gate connected to the gate of the seventh transistor and connected to the second clock terminal, and a source receiving the ground voltage.

In an exemplary embodiment of the present invention, the fifth transistor may maintain the signal of the first node at the ground voltage in response to the signal of the second node, during a period in which a signal of the third clock terminal is high.

In an exemplary embodiment of the present invention, the sixth transistor may maintain a signal of the output terminal at the ground voltage in response to the signal of the second node, during a period in which a signal of the third clock terminal is high.

In an exemplary embodiment of the present invention, the seventh transistor may maintain the first node at the ground voltage in response to the signal of the second clock terminal, during a period in which a signal of the second clock terminal of which a phase is opposite to a phase of a signal of the third clock terminal is high.

In an exemplary embodiment of the present invention, the eighth transistor may maintain the output terminal at the ground voltage in response to the signal of the second clock terminal, during a period in which a signal of the second clock terminal is high.

In an exemplary embodiment of the present invention, the present stage further may include a carry part outputting a signal of the first clock terminal through a carry terminal as a carry signal in response to the signal of the first node, and a carry holding part outputting the ground voltage through the carry terminal as the carry signal in response to a signal of the second clock terminal.

In an exemplary embodiment of the present invention, a phase of the vertical start signal is synchronized with a phase of a signal of the third clock terminal, and a pulse width of the vertical start signal may be substantially half of a pulse width of the signal of the third clock terminal.

According to another exemplary embodiment of the present invention, a method of driving a gate line of a device including a shift register including three or more stages connected in series includes maintaining, at a stage, a first node signal at a high level based on one of a previous stage or a vertical start signal, outputting a clock signal as a gate signal provided to the gate line in response to the first node signal in a high state, maintaining the first node signal at a ground voltage in response to a clock signal of at least one of the next two stages, maintaining the gate signal at the ground voltage in response to a clock signal of at least one of the next stage and a third stage beyond the stage in the series, and maintaining the gate signal at the ground voltage in response to one of the next stage or the vertical start signal.

In an exemplary embodiment of the present invention, the method may further include deactivating the gate signal when an output enable signal which actives the gate signal of the next stage is high.

According to another exemplary embodiment of the present invention, a gate drive circuit includes a plurality of stages are connected in series, the gate drive circuit sequentially activating a plurality of gate lines. A present stage includes a buffer part, a pull-up part, a first node holding part and a gate holding part. The buffer part provides a first node with a signal having a high level based on one of a previous stage or a vertical start signal. The pull-up part outputs a present clock signal of a first clock terminal through an output terminal in response to the signal of the first node. The first node holding part maintains the signal of the first node at a ground voltage in response to a next clock signal of one of next stages. The gate holding part maintains a signal of the output terminal at the ground voltage in response to the next clock signal of one of the next stages.

In an exemplary embodiment of the present invention, the present stage may further include a pull-down part outputting the ground voltage through the output terminal in response to one of the next stage or the vertical start signal.

In an exemplary embodiment of the present invention, a phase of the vertical start signal may be synchronized with a phase of the present clock signal, and a pulse width of the vertical start signal may be substantially equal to a pulse width of the present clock signal.

In an exemplary embodiment of the present invention, the first node holding part may include a first maintaining part maintaining the signal of the first node at the ground voltage in response to the next clock signal of one of the next stages, and a second maintaining part maintaining the signal of the first node at the ground voltage in response to the next clock signal of one of the next stages. The gate holding part may include a third maintaining part maintaining the signal of the output terminal at the ground voltage in response to the next clock signal of one of the next stages, and a fourth maintaining part maintaining the signal of the output terminal at the ground voltage in response to the next clock signal of one of the next stages.

According to a method of driving a gate line and a gate drive circuit for performing the method, during a period in which a gate signal is low, a first node receives a ground voltage and an output terminal outputs the gate signal corresponding to the ground voltage, so that characteristic changes caused by voltage stress may be prevented.

BRIEF DESCRIPTION OF THE DRAWINGS

The present invention will become more apparent by describing in detailed exemplary embodiments thereof with reference to the accompanying drawings, in which.

DETAILED DESCRIPTION OF EXEMPLARY EMBODIMENTS

Figure 1:
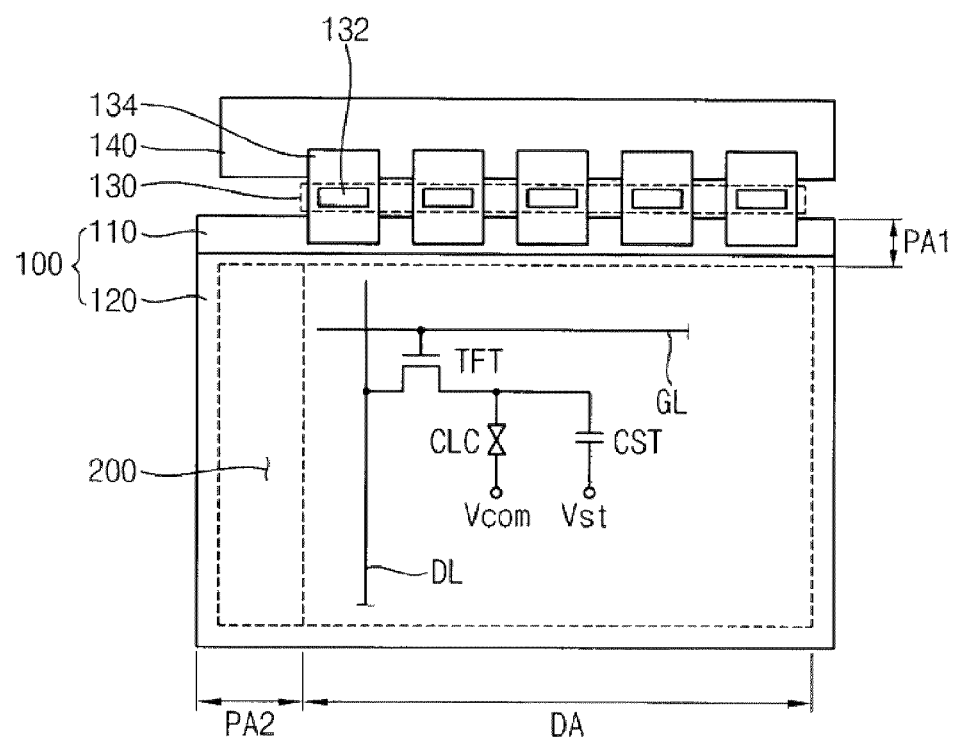
FIG. 1 is a plan view illustrating a display device according to an embodiment of the present invention.

The present invention is described more fully hereinafter with reference to the accompanying drawings, in which exemplary embodiments of the present invention are shown. The present invention may, however, be embodied in many different forms and should not be construed as limited to exemplary embodiments set forth herein. Rather, exemplary embodiments are provided so that this disclosure will be thorough and complete, and will fully convey the scope of the present invention to those skilled in the art. In the drawings, the sizes and relative sizes of layers and regions may be exaggerated for clarity.

The terminology used herein is for the purpose of describing particular example embodiments only and is not intended to be limiting of the present invention.

Hereinafter, the present invention will be explained in detail with reference to the accompanying drawings.

FIG. 1 is a plan view illustrating a display device according to an exemplary embodiment of the present invention.

Referring to FIG. 1, the display device includes a display panel 100, a gate drive circuit 200 and a data driving part 130.

The display panel 100 includes an array substrate 110, an opposite substrate 120 facing the array substrate 110, and a liquid crystal layer interposed between the array substrate 110 and the opposite substrate 120. The display panel 100 includes a display area DA and a peripheral area PA surrounding the display area DA.

The display area DA includes a plurality of pixel parts. Each pixel part may be electrically connected to a gate lines GL and a data lines DL crossing the gate line GL. Each pixel part P includes a transistor TR electrically connected to a liquid crystal capacitor CLC and a storage capacitor CST.

For example, a gate and a source of the transistor TR are electrically and respectively connected to the gate line GL and the data line DL. Moreover, a drain of the transistor TR is electrically connected to the liquid crystal capacitor CLC and the storage capacitor CST.

The peripheral area PA includes a first peripheral area PA1 disposed at one end of the data line DL and a second peripheral area PA2 disposed at one end of the gate line GL.

The data driving part 130 provides the data line DL with a data signal synchronized with a gate signal through the gate line GL. The data driving part 130 may include at least one data driving chip 132.

The data driving chip 132 may be mounted on a flexible printed circuit board (FPCB) 134.

A first end portion of the FPCB 134 is connected to the first peripheral area PA1 of the display panel 100, and a second end portion of the FPCB 134 is connected to a printed circuit board (PCB) 140. The FPCB 134 is an anisotropic conductive film, and the FPCB 134 connects between the display panel 100 and the PCB 140.

The data drive chip 132 may be mounted on the FPCB 134 through a tape carrier package (TCP) method. The data drive chip 132 may be mounted on the array substrate 110 through a chip-on-glass (COG) method. Accordingly, an additional receiving space may not be needed, and thus a display apparatus having a reduced thickness may be realized.

The gate drive circuit 200 is an integrated circuit that is integrated in the second peripheral area PA2. The gate drive circuit 200 may include a shift register, which includes a plurality of stages sequentially outputting gate signals of a high level to the gate lines GL.

Figure 2:
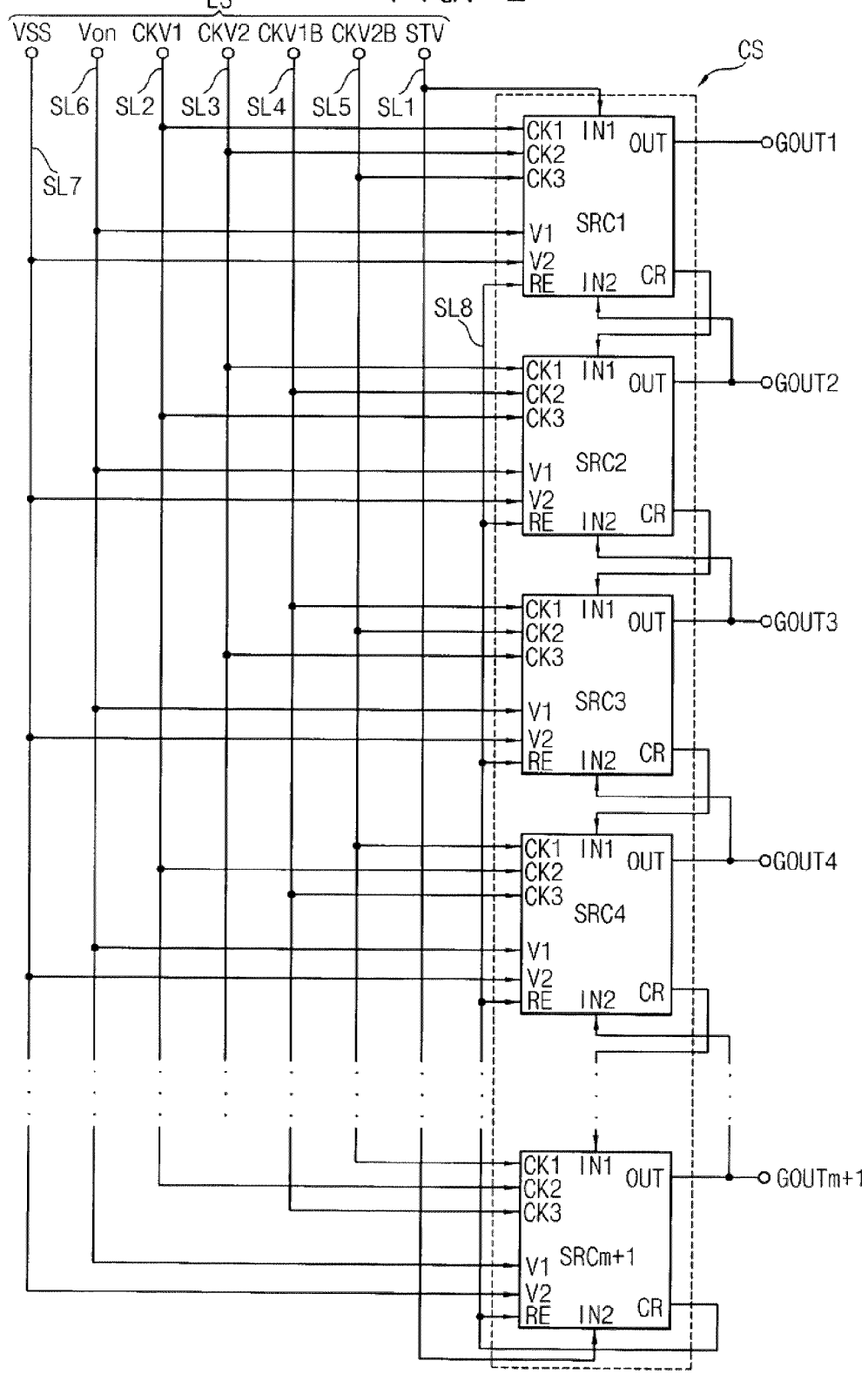
FIG. 2 is a block diagram illustrating the gate drive circuit of FIG. 1.

FIG. 2 is a block diagram illustrating the gate drive circuit 200 of FIG. 1.

Referring to FIGS. 1 and 2, the gate drive circuit 200 includes a shift register CS including a first stage SRC1 to an (m+1)-th stage SRC(m+1) ('m' is a natural number greater than two) connected in series to each other. The gate drive circuit 200 may further include a line part LS extended along first end sides of the first stage SRC1 to the (m+1)-th stage SRC(m+1) to provide the first stage SRC1 to the (m+1)-th stage SRC(m+1) with a synchronizing signal and a driving voltage.

The shift register CS includes (m+1) stages. The (m+1) stages include m driving stages and a dummy stage. The m driving stages are the first stage SRC1 to the m-th stage SRCm and the dummy stage is the (m+1)-th stage SRC(m+1). The first stage SRC1 to m-th stage SRCm output a first gate signal GOUT1 to m-th gate signal GOUTm.

Each stage includes a first clock terminal CK1, a second clock terminal CK2, a third clock terminal CK3, a first input terminal IN1, a second input terminal IN2, a first power terminal V1, a second power terminal V2, a reset terminal RE, a carry terminal CR and an output terminal OUT.

The first clock terminal CK1, the second clock terminal CK2 and the third clock terminal CK3 alternately receive a first clock signal CKV1, a second clock signal CKV2, a third clock signal CKV1B and a fourth clock signal CKV2B—the first clock signal CKV1, the second clock signal CKV2, the third clock signal CKV1B and the fourth clock signal CKV2B are alternatively applied to each of the stages. Here, the second clock signal CKV2 may be a signal delayed by about ¼ period of the first clock signal CKV1. The third clock signal CKV1B may be a signal inverted from the first clock signal CKV1. The fourth clock signal CKV2B may be a signal inverted from the second clock signal CKV2.

For example, in the first stage SRC1, a first clock terminal CK1 receives the first clock signal CKV1, a second clock terminal CK2 receives the second clock signal CKV2, and a third clock terminal CK3 receives the fourth clock signal CKV2B.

In a second stage SRC2, a first clock terminal CK1 receives the second clock signal CKV2, a second clock terminal CK2 receives the third clock signal CKV1B, and a third clock terminal CK3 receives the first clock signal CKV1.

In a third stage SRC3, a first clock terminal CK1 receives the third clock signal CKV1B, a second clock terminal CK2 receives the fourth clock signal CKV2B, and a third clock terminal CK3 receives the second clock signal CKV2.

In a fourth stage SRC4, a first clock terminal CK1 receives the fourth clock signal CKV2B, a second clock terminal CK2 receives the first clock signal CKV1, and a third clock terminal CK3 receives the third clock signal CKV1B.

That is, an order of applying the first clock signal CKV1, the second clock signal CKV2, the third clock signal CKV1B and the fourth clock signal CKV2B to the first to third clock terminals CK1 to CK3 of the first to fourth stages may be repeatedly applied to first to third clock terminals CK1 to CK3 of fifth to (m+1)-th stages.

Here, the first clock signal CKV1 has a phase opposite to the third clock signal CKV1B, and the second clock signal CKV2 has a phase opposite to the fourth clock signal CKV2B.

The first input terminal IN1 receives a vertical start signal STV or a carry signal of a previous stage.

For example, a first input terminal IN1 of the first stage SRC1 receives the vertical start signal STV provided from an external device (not shown). Each of the second to (m+1)-th stages SRC2 to SRC(m+1) receives the carry signal provided from the carry terminal CR of the previous stage.

That is, the first input terminals IN1 of the second to (m+1)-th stages SRC2 to SRC(m+1) receive the carry signals respectively provided from the first to m-th stages SRC1 to SRCm.

The second input terminals IN2 of the first to (m+1)-th stages SRC1 to SRC(m+1) receive a gate signal or the vertical start signal STV.

For example, a second input terminal IN2 of the (m+1)-th stage SRC(m+1) receives the vertical start signal STV. The second input terminal IC2 of each of the first to m-th stages SRC1 to SRCm receives the gate signal provided from the next stage.

That is, the second input terminals IN2 of the first to m-th stages SRC1 to SRCm receive the gate signals respectively provided from the second to (m+1)-th stages SRC2 to SRC(m+1).

The first power terminal V1 and the second power terminal V2 respectively receive a turn-on voltage and a ground voltage Vss.

For example, the turn-on voltage Von provided to the first power terminal V1 may be about 20 V.

The reset terminal RE receives a carry signal provided from a carry terminal of the (m+1)-th stage SRC(m+1) that is the last stage.

The carry terminal CR and the output terminal OUT outputs the carry signal and the output signal based on the first clock signal CKV1, the second clock signal CKV2, the third clock signal CKV1B and the fourth clock signal CKV2B provided through the first clock terminal CK1.

For example, a carry terminal CR and an output terminal OUT respectively output a first carry signal CR1 and a first gate signal GOUT1, in the first stage SRC1 of the (m+1) stages.

A carry terminal CR and an output terminal OUT respectively output a second carry signal CR2 and a second gate signal GOUT2, in the second stage SRC2 of the (m+1) stages.

A carry terminal CR and an output terminal OUT respectively output a third carry signal CR3 and a third gate signal GOUT3, in the third stage SRC3 of the (m+1) stages.

A carry terminal CR and an output terminal OUT respectively output a fourth carry signal CR4 and a fourth gate signal GOUT4, in the fourth stage SRC4 of the (m+1) stages.

Therefore, the fifth to (m+1)-th stages SRC5 to SRC(m+1) respectively output fifth to (m+1) carry signals and fifth to (m+1) gate signals, repeatedly based on the first clock signal CKV1, the second clock signal CKV2, the third clock signal CKV1B and the fourth clock signal CKV2B.

The line part LS, which provides the (m+1) stages with the synchronizing signal and the driving voltage, includes a start signal line SL1, a first clock line SL2, a second clock line SL3, a third clock line SL4, a fourth clock line SL5, a first power line SL6, a second power line SL7 and a reset line SL8.

The start signal line SL1 receives the vertical start signal STV from an external device (not shown), and provides the vertical start signal STV to the first input terminal IN1 of the first stage SRC1 and the second terminal IN2 of the (m+1)-th stage SRC(m+1).

The first clock line SL2 receives the first clock signal CKV1 from the external device, and provides first clock terminals CK1 of the first stage SRC1 and (4p+1)-th stages ('p' is a natural number) with the first clock signal CKV1.

Moreover, the first clock line SL2 provides the first clock signal CKV1 to third clock terminals CK3 of the second stage SRC2 and (4p+2)-th stages, and second clock terminals CK2 of (4p)-th stages, where p is a natural number.

The second clock line SL3 receives the second clock signal CKV2 from the external device, and provides first clock terminals CK1 of the second stage SRC2 and the (4p+2)-th stages with the second clock signal CKV2.

Moreover, the second clock line SL3 provides third clock terminals CK3 of the third stage SRC3 and (4p+3)-th stages, and second clock terminals CK2 of the first stage SRC1 and the (4p+1)-th stages with the second clock signal CKV2.

The third clock line SL4 receives the third clock signal CKV1B from the external device, and provides first clock terminals CK1 of the third stage SRC3 and the (4p+3)-th stages with the third clock signal CKV1B.

Moreover, the third clock line SL4 provides third clock terminals CK3 of the (4p)-th stages, and second clock terminals CK2 of the second stage SRC2 and the (4p+2)-th stages with the third clock signal CKV1B.

The fourth clock line SL5 receives the fourth clock signal CKV2B from the external device, and provides first clock terminals CK1 of the (4p)-th stages with the fourth clock signal CKV2B.

Moreover, the fourth clock line SL5 provides third clock terminals CK3 of the first stage SRC1 and the (4p+1)-th stages, and second clock terminals CK2 of the third stage SRC3 and the (4p+3)-th stages with the fourth clock signal CKV2B.

The first power line SL6 and the second power line SL7 respectively receive the turn-on voltage Von and the ground voltage Vss from the external device, and respectively provide the first power terminals V1 and the second power terminals V2 of the (m+1) stages with the turn-on voltage Von and the ground voltage Vss.

The reset line SL8 receives the carry signal provided from the (m+1)-th stage SRC(m+1), and provides the reset terminals RE of the (m+1) stages with the carry signal.

Figure 3:
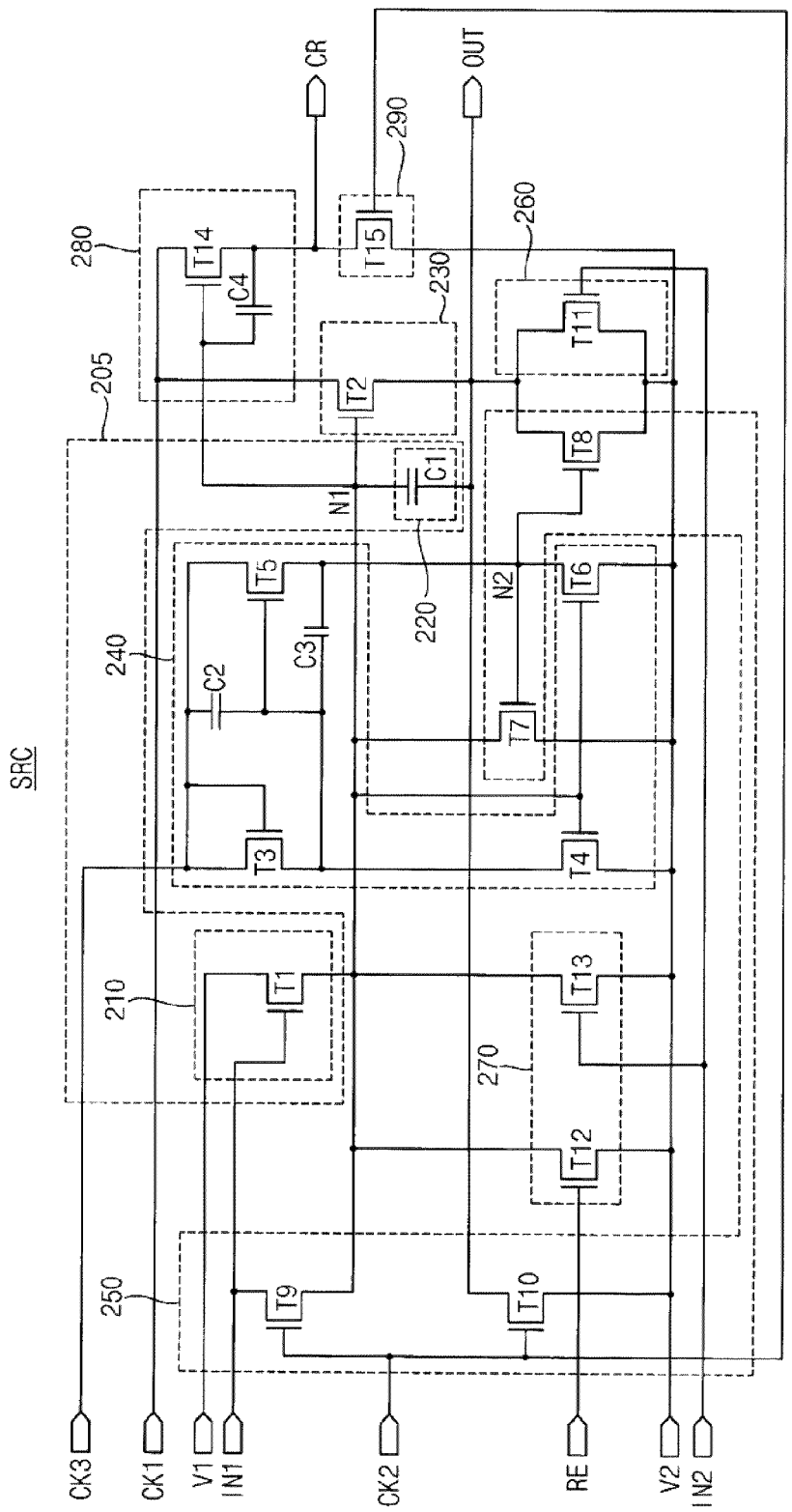
FIG. 3 is a circuit diagram illustrating a stage of FIG. 2.
Figure 4:
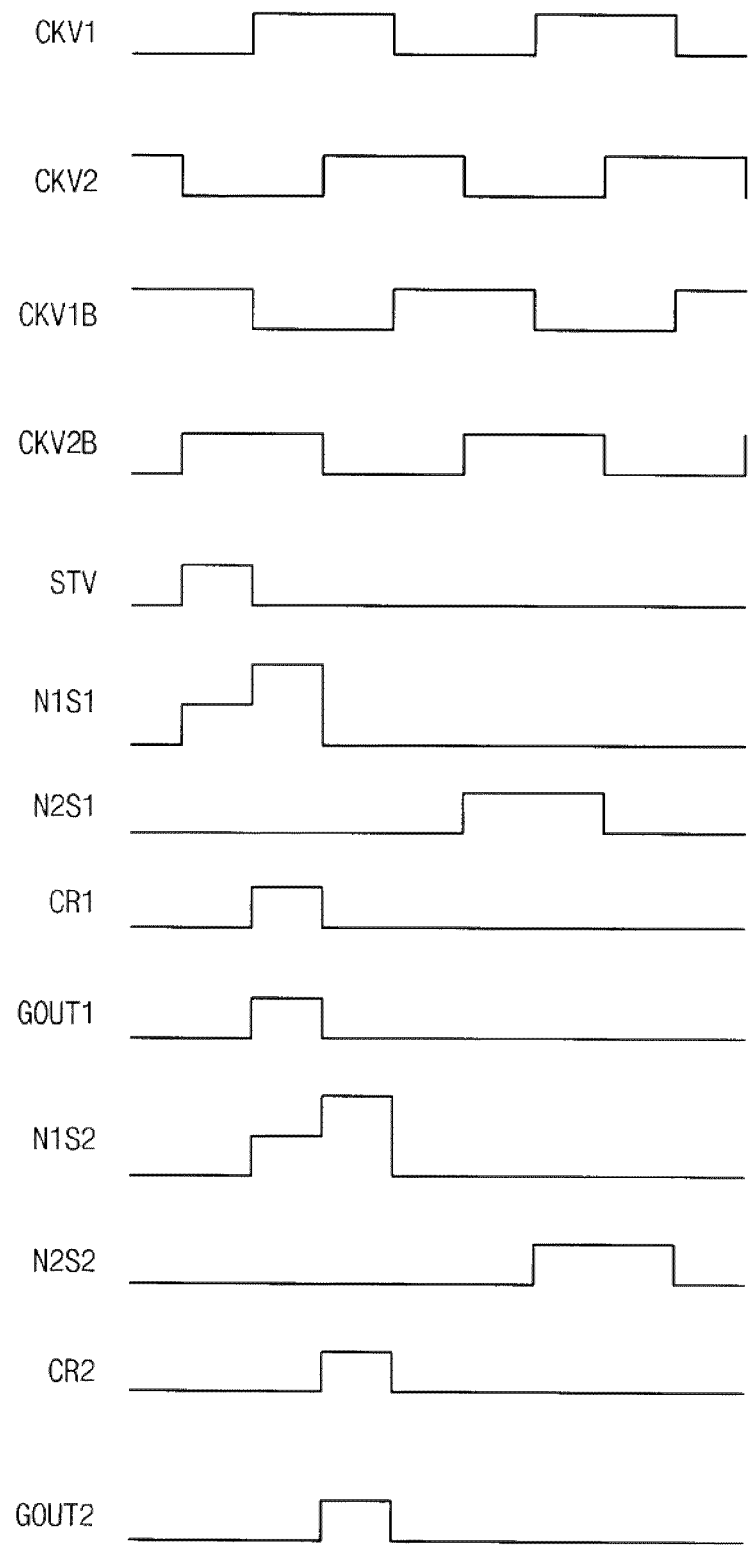
FIG. 4 is a waveform diagram illustrating input/output signals of the gate drive circuit of FIG. 3.

FIG. 3 is a circuit diagram illustrating a stage of FIG. 2. FIG. 4 is a waveform diagram illustrating input/output signals of the gate drive circuit of FIG. 3.

Referring to FIGS. 2 through 4, an m-th stage SRCm of the gate driving part 200 includes a buffer part 210, a charging part 220, a pull-up part 230, a first holding part 240, a second holding part 250, a pull-down part 260, a discharging part 270, a carry part 280 and a carry holding part 290. An (m−1)-th stage SRC(m−1) is referred to as a "previous stage," and the (m+1)-th stage SRC(m+1) is referred to as a "next stage", where 'm' is a natural number.

A gate (or a control electrode) of the buffer part 210 that is connected to the first input terminal IN1 receives a signal of the first input terminal IN1 (hereinafter referred to as first input signal) to provide a first node N1 with the turn-on signal in accordance with the first input signal. Here, a signal provided to the first node N1 of the m-th stage SRCm is referred to as a "first node signal N1Sm."

A drain (or a first current electrode) of the buffer part 210 that is connected to the first power terminal V1 receives a signal of the first power terminal V1 (hereinafter referred to as turn-on signal). A source (or a second current electrode) of the buffer part 210 that is connected to a first end of the charging part 220 includes a first transistor T1 forming the first node N1.

The turn-on signal is a direct current (DC) signal so that the turn-on signal is provided to the first power terminal V1 without delays of clock signals of the first to third clock terminals CK1 to CK3. Thus, the carry signal may be more accurate, and a low temperature margin may be enhanced.

The buffer part 210 operates as a diode to provide the first node N1 with the turn-on signal in accordance with the first input signal. For example, when the first input signal is in a high state, a high level signal is provided to the first node N1 as the first node signal N1Sm.

That is, the first transistor T1 is turned on by being synchronized with the vertical start signal STV so that the high level signal is provided to the first node N1. Alternatively, buffer parts 210 of the second to (m+1)-th stages SRC2 to SRC(m+1) receive gate signals of previous stages as the first input signals.

Here, a phase of the vertical start signal STV is synchronized with a signal provided with the third clock terminal CK3, a pulse width of the vertical start signal STV may be substantially half of the signal provided with the third clock terminal CK3.

For example, the signal provided to the third clock terminal CK3 may be the fourth clock signal CKV1B, and the vertical start signal STV synchronizes the first clock signal CKV1, in the first stage SRC1.

The first end of the charging part 220 is connected to the source of the first transistor T1 to form the first node N1, and a second end of the charging part 220 charges a first capacitor C1 to a high level provided from the buffer part 210 to maintain the first node N1 at the high level.

That is, the buffer part 210 and the charging part 220 may be realized as a pull-up driving part 205. The pull-up driving part 205 maintains the first node N1 at a high level including a first high level and/or a second high level to control the pull-up part 230.

The pull-up part 230 includes a second transistor of which a drain is connected to the first clock terminal CK1, a gate is connected to a first end of the first capacitor C1 to form the first node N1, and a source is connected to a second end of the first capacitor C1 and the output terminal.

The pull-up part 230 outputs a gate signal GOUT of a high level through the output terminal OUT based on the first clock signal CKV1, the second clock signal CKV2, the third clock signal CKV1B and the fourth clock signal CKV2B provided from the first clock terminal CK1, in response to the signal of the first node N1.

For example, the first stage SRC1 and the (4p+1)-th stages output the gate signal GOUT based on the first clock signal CKV1.

The second stage SRC2 and the (4p+2)-th stages output the gate signal GOUT based on the second clock signal CKV2.

The third stage SRC3 and the (4p+3)-th stages output the gate signal GOUT based on the third clock signal CKV1B.

The (4p)-th stages output the gate signal GOUT based on the fourth clock signal CKV2B.

The first holding part 240 includes a third transistor T3, a fourth transistor T4, a fifth transistor T5, a sixth transistor T6, a second capacitor C2 and a third capacitor C3. When a signal of the third clock signal CKV1B is in a high state and a signal of the first node N1 is in a low stage, the first holding part 240 maintains a second node N2 at the high level. Here, a signal provided to the second node N2 of the m-th stage SRCm is referred to as a "second node signal N2Sm."

A drain and a gate of the third transistor T3 are connected to the third clock terminal CK3, and a source of the third transistor T3 is connected to a drain of the fourth transistor T4.

A gate of the fourth transistor T4 is connected to the first node N1, and a source of the fourth transistor T4 is connected to the second power terminal V2.

A drain of the fifth transistor T5 is connected to the third clock terminal CK3, and a gate of the fifth transistor T5 is connected to the source of the third transistor T3 and the drain of the fourth transistor T4.

A drain of the sixth transistor T6 is connected to a source of the fifth transistor T5 to form the second node N2, the gate of the sixth transistor T6 and the gate of the fourth transistor T4 are each connected to the first node N1, and a source of the sixth transistor T6 is connected to the second power terminal V2.

The second capacitor is connected between the drain and the gate of the fifth transistor T5, and the third capacitor is connected between the gate and the source of the fifth transistor T5.

The first holding part 240 controls the second holding part 250 with the second node signal N2Sm of the second node N2.

For example, a control voltage synchronized with the signal of the third clock terminal CK3 is provided to the second node N2 through the fifth transistor T5. Thus, during a period in which the signal of the third clock terminal CK3 is high, the signal of the second node N2 is high when the signal of the first node N1 is low. Alternatively, when the signal of the first node N1 is high, the fifth transistor T5 is turned on so that a low level signal is applied to the signal of the second node N2.

Therefore, a signal synchronized with the signal of the third clock terminal CK3 is provided to the second node N2 except when the signal of the output terminal OUT is high. When the signal of the output terminal OUT is high, the second node N2 is low.

The second holding part 250, which includes a seventh transistor T7, an eighth transistor T8, a ninth transistor T9 and a tenth transistor T10, maintains the signals of the first node N1 and the output terminal OUT at the ground voltage Vss in response to the signal of the second node N2, and maintains the signal of the first node N1 at the ground voltage Vss in response to a signal of the second clock terminal CK2.

For example, a drain of the seventh transistor T7 is connected to the first node N1, a gate of the seventh transistor T7 is connected to the first holding part 240, and a source of the seventh transistor T7 is connected to the second power terminal V2 to receive the ground voltage Vss.

A drain of the eighth transistor T8 is connected to the output terminal OUT, a gate of the eighth transistor T8 is connected to the second node N2 of the first holding part 240, and a source of the eighth transistor T8 is connected to the second power terminal V2.

A drain of the ninth transistor T9 is connected to the first input terminal IN1 to receive the first input signal, a gate of the ninth transistor T9 is connected to the second input terminal CK2, and a source of the ninth transistor T9 is connected to the first node N1.

A drain of the tenth transistor T10 is connected to the output terminal OUT, a gate of the drain of the tenth transistor T10 and the gate of the ninth transistor T9 are connected to the second clock terminal CK2, and a source of the drain of the tenth transistor T10 is connected to the second power terminal V2.

Here, the signal of the second clock terminal CK2 may be a signal delayed by about ¼ period of the signal of the first clock terminal CK1. The signal of the third clock terminal CK3 may be a signal delayed by about ¾ period of the signal of the first clock terminal CK1.

For example, the first clock signal CKV1 is provided to the first clock terminal CK1 of the first stage SRC1. Thus, the second clock signal CKV2 provided to the second clock terminal CK2 may be the signal delayed by about ¼ period of the first clock signal CKV1. Moreover, phases of the second clock signal CKV2 of the second clock terminal CK2 and the fourth clock signal CKV2B of the third clock terminal CK3 may be opposite to each other.

The second holding part 250 causes the output terminal OUT to output the low gate signal GOUT after the pull-down part 260 operates. That is, the second holding part 250 provides the output terminal OUT with the ground voltage Vss in response to a low gate signal GOUT. Moreover, the second holding part 250 performs holding of the turned-off second transistor T2 in the pull-up part 230 by providing the first node N1 with the ground voltage Vss.

For example, when the signal of the third clock terminal CK3 is high, the signal of the second node N2 is high so that the seventh and eighth transistors T7 and T8 are turned on. Thus, the ground voltage Vss is output from the output terminal OUT through the eighth transistor T8. Moreover, the ground voltage Vss is provided to the first node N1 through the seventh transistor T7 so that the second transistor T2 is turned off.

Moreover, when the signal of the third clock terminal CK3 is low, the signal of the second clock terminal CK2 is high so that the ground voltage Vss is output from the output terminal through the tenth transistor T10 and the ground voltage Vss is provided to the first node N1 through the ninth transistor T9.

Thus, the eighth and tenth transistors T8 and T10 are alternately turned on so that the output terminal OUT outputs the ground voltage Vss.

Therefore, when the signal of the second clock terminal CK2 is high and the signal of the third clock terminal CK3 is high, the ground voltage Vss may be provided to the first node N1. Here, the signals of the second clock terminal CK2 may have a phase opposite to the third clock terminal CK3.

Accordingly, during a period in which the signal of the first node N1 is not high, the ground voltage Vss may be provided to the first node N1. Thus, high temperature noise defects may be substantially removed and a high temperature margin may be enhanced.

Moreover, a leakage current may not be generated when the charging part 220 performs a boosting up operation because the second holding part 250 does not have a transistor to output the signal of the first node N1 to the output terminal OUT based on the signal of the first clock terminal CK1. Thus, a low temperature margin may be enhanced.

A drain of the pull-down part 260 includes an eleventh transistor T11 that includes a drain connected to the output terminal OUT, a gate of the pull-down part 260 is connected to the second input terminal 1N2 to receive the second input signal, and a source of the pull-down part 260 is connected to the second power terminal V2 to receive the ground voltage Vss.

The pull-down part 260 provides the ground voltage Vss to the output terminal OUT in response to a signal of the second input terminal 1N2 (hereinafter referred to as second input signal). That is, the pull-down part 260 is turned on to provide the ground voltage Vss to the output terminal OUT when the second input signal is high.

The discharging part 270 a twelfth transistor T12 and a thirteenth transistor T13, and discharges electric charges from the charging part 220 to the second power terminal V2. Moreover, the discharging part 270 discharges electric charges from the charging part 220 to the second power terminal V2 in response to a carry signal from the (m+1)-th stage SRC(m+1) that is the last stage.

For example, a drain of the twelfth transistor T12 is connected to the first node N1, a gate of the twelfth transistor T12 is connected to the reset terminal RE to receive the carry signal from the (m+1)-th stage SRC(m+1), and a source of the twelfth transistor T12 is connected to the second power terminal V2.

A drain of the thirteenth transistor T13 is connected to the first node N1, a gate of the thirteenth transistor T13 is connected to the second input terminal IN2 to receive the second input signal, and a source of the thirteenth transistor T13 is connected to the second power terminal V2.

The carry part 280 includes a fourteenth transistor T14 and a fourth capacitor C4, and outputs the carry signal to the carry terminal CR based on the signal of the first clock terminal CK1. Here, the carry signal from the carry terminal CR of the m-th stage is referred to as an "m-th carry signal CRm."

A drain of the fourteenth transistor T14 is connected to the first clock terminal CK1, a gate of the fourteenth transistor T14 is connected to the first node N1, and a source of the fourteenth transistor T14 is connected to the carry terminal CR. The fourth capacitor C4 is connected between the gate and source of the fourteenth transistor T14.

Here, the carry part 280 receives the signal of the first clock terminal CK1 that is electrically separated from the output terminal so that a normal carry signal may be output to induce normal operation of the (m+1)-th stage SRC(m+1) that is the next stage following the m-th stage.

The carry holding part 290 includes a fifth transistor T15. A drain of the fifth transistor T15 is connected to the carry terminal CR, a gate of the fifth transistor T15 is connected to the second clock terminal CK2, and a source is connected to the second power terminal V2.

Therefore, when the signal of the second clock terminal CK2 is high, the carry terminal CR outputs the ground voltage Vss from the second power terminal V2 as the carry signal so that the carry signal may be in a stable low state.

Figure 5:
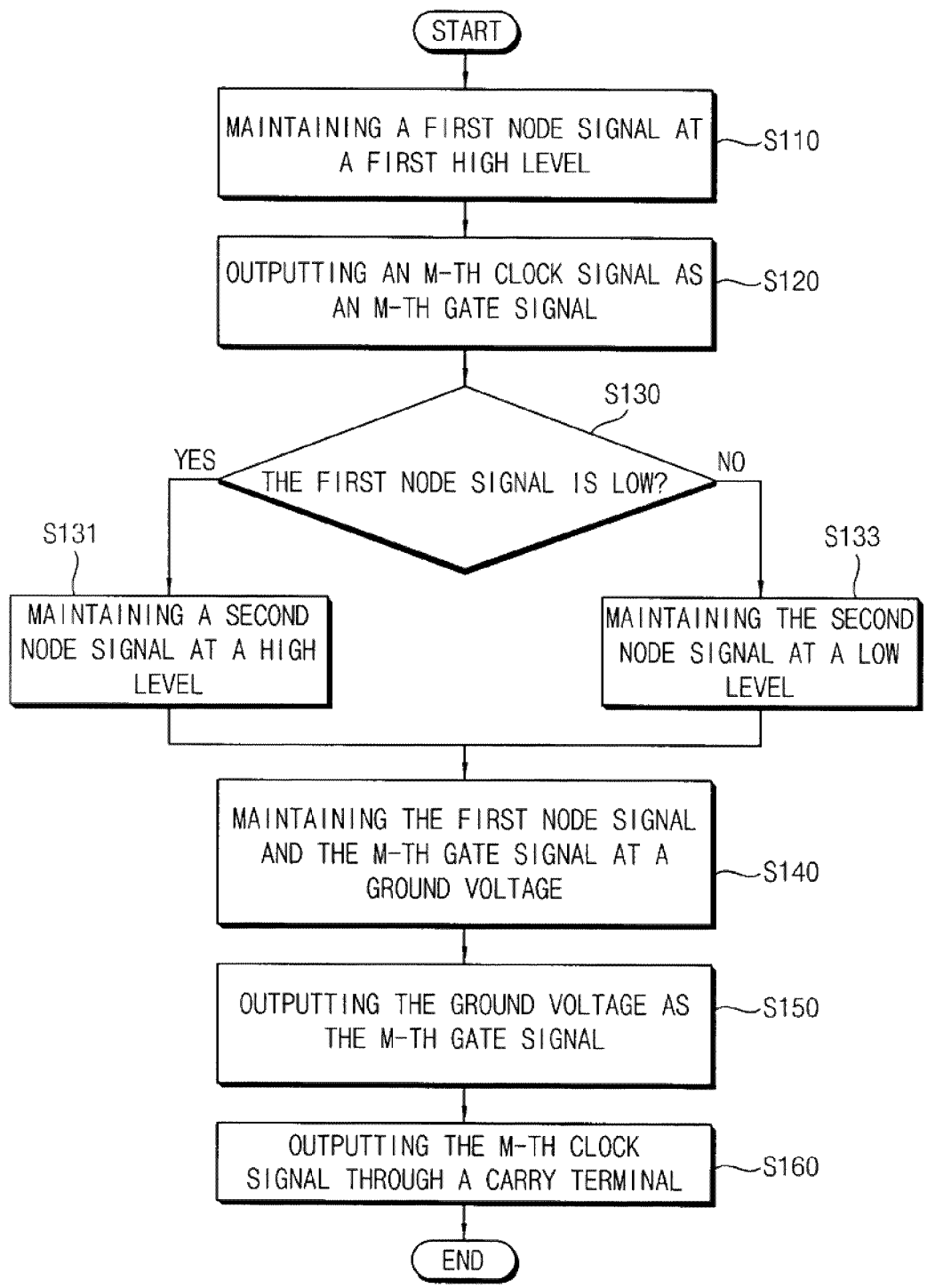
FIG. 5 is a flowchart illustrating a gate line driving method of driving the gate drive circuit of FIG. 2.

FIG. 5 is a flowchart illustrating a method of driving the gate drive circuit of FIG. 2.

Referring to FIGS. 2 through 5, a method of activating an m-th gate line will be described.

The buffer part 210 maintains the first node signal N1Sm that is the signal of the first node N1 at the first high level based on an (m−1)-th carry signal from the carry terminal CR or the vertical start signal STV (block S110).

Here, the turn-on voltage Von is provided to the first node N1 so that the charging part 220 may provide electric charges. Thus, the first node signal N1Sm may be maintained at the first high level.

Then, the pull-up part 230 outputs an m-th clock signal through the output terminal OUT as an m-th gate signal that is provided to the m-th gate line in response to the first node signal N1Sm (block S120). Here, the m-th gate clock signal may be the first clock signal CKV1, the second clock signal CKV2, the third clock signal CKV1B and the fourth clock signal CKV2B. Moreover, the first node signal N1Sm may be boosted up to the second high level higher than the first high level when the m-th gate signal is output.

Then, the first holding part 240 determines whether or not the first node signal N1Sm is low, during a period in which an (m+3)-th clock signal that is a signal delayed by about ¾ period of the m-th clock signal is high (block S130).

When, the first node signal N1Sm is low, the second node signal N2Sm is maintained at the high level (block S131). In contrast, when the first node signal N1Sm is high, the second node signal N2Sm is maintained at the low level (block S133).

In other words, during a period in which the (m+3)-th clock signal that is the signal delayed by about ¾ period of the m-th clock signal is high and the first node signal N1Sm is high, the first holding part 240 maintains the second node signal N2Sm at the high level.

Accordingly, during a period in which the first node signal N1Sm is high, that is, during a period in which the m-th gate clock signal is output through the output terminal OUT as the m-th gate signal, the output terminal OUT is substantially prevented from outputting the ground voltage. Thus, except when the first node signal N1Sm is high, that is, when the (m+3)-th clock signal is high, the output terminal OUT outputs the ground voltage Vss.

The second holding part 250 maintains the first node signal N1Sm at the ground voltage Vss and outputs the ground voltage Vss as the m-th gate signal in response to the second node signal N2Sm and an (m+1)-th clock signal that is a signal delayed by about ¼ period of the m-th clock signal (block S140).

Accordingly, except when the m-th clock signal is output through the output terminal OUT, that is, when the (m+3)-th clock signal is high, the first holding part 240 maintains the first node signal N1Sm at the ground voltage Vss and outputs the ground voltage Vss as the m-th gate signal.

Moreover, during a period in which the (m+1)-th clock signal is high, the second holding part 250 maintains the first node signal N1Sm at the ground voltage Vss and outputs the ground voltage Vss as the m-th gate signal.

Here, the (m+1)-th clock signal has a phase opposite to the (m+3)-th clock signal, so that the first node N1 may stably receive the ground voltage Vss during a period in which the first node N1 does not receive a high level signal. Therefore, high temperature noise defects may be substantially removed, so that a high temperature margin may be enhanced.

The pull-down part 260 outputs the ground voltage Vss as the m-th gate signal in response to an (m+1) gate signal or the vertical start signal STV (block S150).

The discharging part 270 discharges electric charges from the charging part 220 to the second power terminal V2 in response to the second input signal. Moreover, the discharging part 270 discharges electric charges from the charging part 220 to the second power terminal V2 in response to a carry signal from the (m+1)-th stage SRC(m+1) that is the last stage.

Then, the carry part 280 outputs the m-th clock signal through the carry terminal CR in response to the first node signal N1Sm (block S160).

Here, when the (m+1)-th clock signal is high, the carry terminal CR outputs the ground voltage Vss from the second power terminal V2 as the m-th carry signal so that the m-th carry signal may be in a stable low state.

Figure 6:
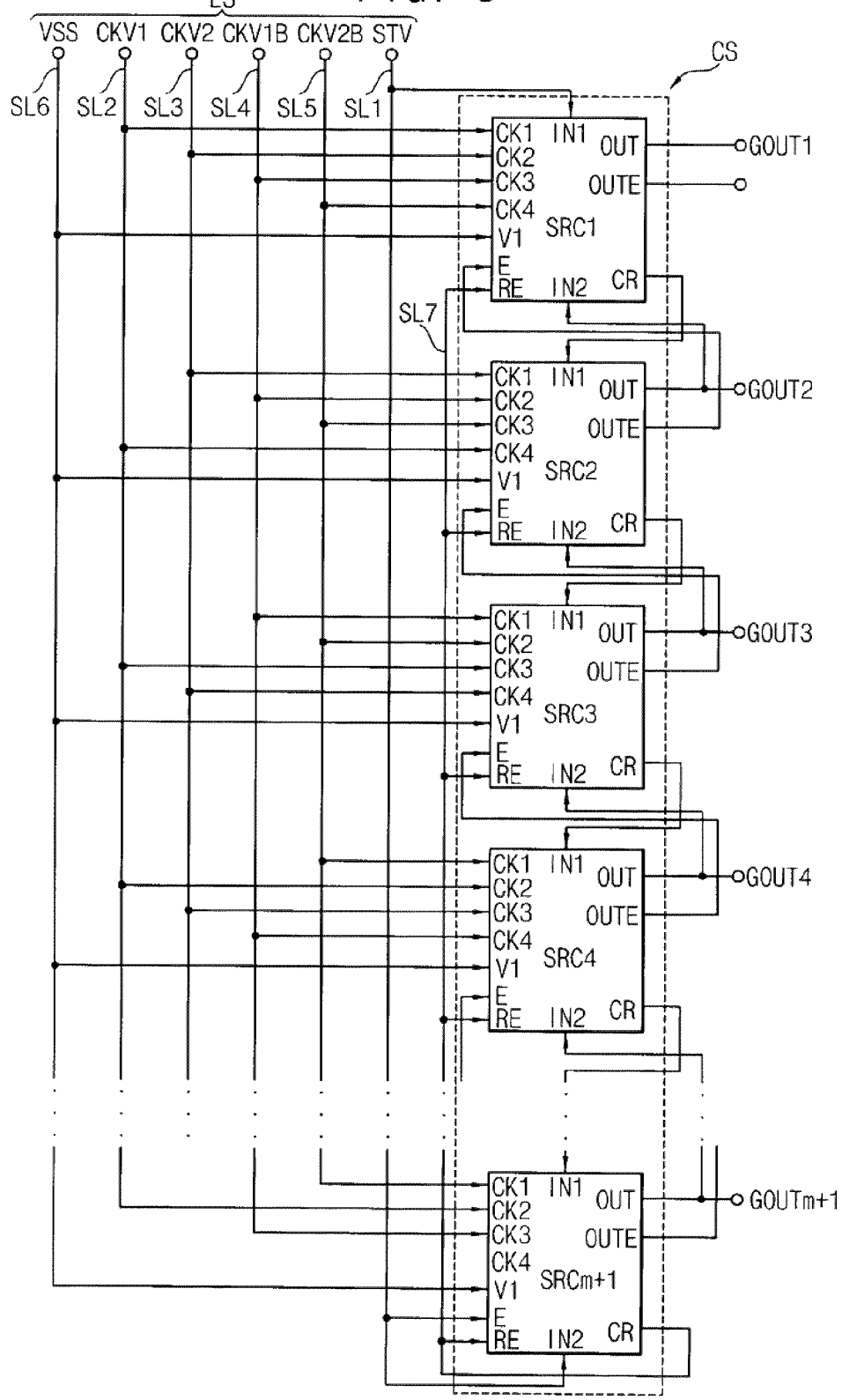
FIG. 6 is a block diagram illustrating a gate drive circuit according to an embodiment of the present invention.

Referring to FIG. 6; FIG. 6 is a block diagram illustrating a gate drive circuit according to an exemplary embodiment of the present invention.

A plan view of a display apparatus according to FIG. 6 is substantially the same as the plan view of the display apparatus according to FIG. 2, and thus the plan view of the display apparatus according to FIG. 6 will be omitted.

Referring to FIGS. 1 and 6, a gate drive circuit 300 includes a shift register CS including a first stage SRC1 to an (m+1)-th stage SRC(m+1) ('m' is a natural number greater than two) dependently connected to each other. The gate drive circuit 300 may further include a line part LS extended along ends of the first stage SRC1 to the (m+1)-th stage SRC(m+1) to provide the first stage SRC1 to the (m+1)-th stage SRC(m+1) with a synchronizing signal and a driving voltage.

The shift register CS includes (m+1) stages. The (m+1) stages include m driving stages and a dummy stage. The m driving stages are the first stage SRC1 to the m-th stage SRCm and the dummy stage is the (m+1)-th stage SRC(m+1). The first stage SRC1 to m-th stage SRCm output a first gate signal GOUT1 to m-th gate signal GOUTm.

Each stage includes a first clock terminal CK1, a second clock terminal CK2, a third clock terminal CK3, a fourth clock terminal CK4, a first input terminal IN1, a second input terminal IN2, a power terminal V1, an enable terminal E, a reset terminal RE, a carry terminal CR, an output enable terminal OUTE and an output terminal OUT.

The first clock terminal CK1, the second clock terminal CK2, the third clock terminal CK3 and the fourth clock terminal CK4 alternately receive a first clock signal CKV1, a second clock signal CKV2, a third clock signal CKV1B and a fourth clock signal CKV2B.

For example, a first clock terminal CK1 receives the first clock signal CKV1, a second clock terminal CK2 receives the second clock signal CKV2, a third clock terminal CK3 receives the third clock signal CKV1B, and a fourth clock terminal CK4 receives the fourth clock signal CKV2B, in the first stage SRC1 of the (m+1) stages.

A first clock terminal CK1 receives the second clock signal CKV2, a second clock terminal CK2 receives the third clock signal CKV1B, a third clock terminal CK3 receives the fourth clock signal CKV2B, and a fourth clock terminal CK4 receives the first clock signal CKV1, in a second stage SRC2 of the (m+1) stages.

A first clock terminal CK1 receives the third clock signal CKV1B, a second clock terminal CK2 receives the fourth clock signal CKV2B, a third clock terminal CK3 receives the first clock signal CKV1, and a fourth clock terminal CK4 receives the second clock signal CKV2, in a third stage SRC3 of the (m+1) stages.

A first clock terminal CK1 receives the fourth clock signal CKV2B, a second clock terminal CK2 receives the first clock signal CKV1, a third clock terminal CK3 receives the second clock signal CKV2, and the fourth clock terminal CK4 receives the third clock signal CKV1B, in a fourth stage SRC4 of the (m+1) stages.

That is, an order of applying the first clock signal CKV1, the second clock signal CKV2, the third clock signal CKV1B and the fourth clock signal CKV2B to the first to fourth clock terminals CK1 to CK4 of the first to fourth stages may be repeatedly applied to first to third clock terminals CK1 to CK3 of fifth to (m+1)-th stages.

The first clock signal CKV1 has a phase opposite to the third clock signal CKV1B, and the second clock signal CKV2 has a phase opposite to the fourth clock signal CKV2B.

The first input terminal IN1 receives a vertical start signal STV or a carry signal of a previous stage.

For example, a first input terminal IN1 of the first stage SRC1 receives the vertical start signal STV provided from an external device. Each of the second to (m+1)-th stages SRC2 to SRC(m+1) receives the carry signal provided from the carry terminal CR of the previous stage.

That is, the first input terminals IN1 of the second to (m+1)-th stages SRC2 to SRC(m+1) receive the carry signals respectively provided from the first to m-th stages SRC1 to SRCm.

The second input terminal 1N2 receives a gate signal or the vertical start signal STV.

For example, a second input terminal IN2 of the (m+1)-th stage SRC(m+1) receives the vertical start signal STV. The second input terminal IC2 of each of the first to m-th stages SRC1 to SRCm receives the gate signal provided from the next stage.

That is, the second input terminals IN2 of the first to m-th stages SRC1 to SRCm receive the gate signals respectively provided from the second to (m+1)-th stages SRC2 to SRC(m+1).

The enable terminal E receives the vertical start signal STV or an output enable signal OUTEV from the output enable terminal OUTE.

For example, the second input terminal 1N2 of the (m+1)-th stage SRC(m+1) receives the vertical start signal STV. The second input terminal IC2 of each of the first to m-th stages SRC1 to SRCm receives the output enable signal OUTEV provided from the next stage.

That is, the enable terminals E of the first to m-th stages SRC1 to SRCm receive the output enable signals OUTEV respectively provided from the second to (m+1)-th stages SRC2 to SRC(m+1).

The power terminal V1 receives a ground voltage Vss.

The reset terminal RE receives a carry signal provided from a carry terminal of the (m+1)-th stage SRC(m+1) that is the last stage.

The carry terminal CR and the output terminal OUT outputs the carry signal and the output signal based on the first clock signal CKV1, the second clock signal CKV2, the third clock signal CKV1B and the fourth clock signal CKV2B that are provided through the first clock terminal CK1.

For example, a carry terminal CR and an output terminal OUT respectively output a first carry signal CR1 and a first gate signal GOUT1, in the first stage SRC1 of the (m+1)

stages. However, when the enable signal E is low, the first gate signal GOUT1 may be the ground voltage Vss.

A carry terminal CR and an output terminal OUT respectively output a second carry signal CR2 and a second gate signal GOUT2, in the second stage SRC2 of the (m+1) stages. When the enable signal E is low, the second gate signal GOUT2 may be the ground voltage Vss.

A carry terminal CR and an output terminal OUT respectively output a third carry signal CR3 and a third gate signal GOUT3, in the third stage SRC3 of the (m+1) stages. When the enable signal E is low, the third gate signal GOUT3 may be the ground voltage Vss.

A carry terminal CR and an output terminal OUT respectively output a fourth carry signal CR4 and a fourth gate signal GOUT4, in the fourth stage SRC4 of the (m+1) stages. When the enable signal E is low, the fourth gate signal GOUT4 may be the ground voltage Vss.

Therefore, the fifth to (m+1)-th stages SRC5 to SRC(m+1) respectively output fifth to (m+1) carry signals and fifth to (m+1) gate signals, repeatedly based on the first clock signal CKV1, the second clock signal CKV2, the third clock signal CKV1B and the fourth clock signal CKV2B.

Moreover, enable terminals of even stages receive high level signals so that gate signals may be output from the even stages.

The line part LS for providing the (m+1) stages the synchronizing signal and the driving voltage includes a start signal line SL1, a first clock line SL2, a second clock line SL3, a third clock line SL4, a fourth clock line SL5, a power line SL6 and a reset line SL7.

The start signal line SL1 receives the vertical start signal STV from an external device, and provides the first input terminal IN1 of the first stage SRC1 and the second terminal IN2 of the (m+1)-th stage SRC(m+1) with the vertical start signal STV.

The first clock line SL2 receives the first clock signal CKV1 from the external device, and provides first clock terminals CK1 of the first stage SRC1 and (4p+1)-th stages ('p' is a natural number) with the first clock signal CKV1.

Moreover, the first clock line SL2 provides fourth clock terminals CK4 of the second stage SRC2 and (4p+2)-th stages, third clock terminals CK3 of the third stage SRC3 and (4p+3)-th stages, and second clock terminals CK2 of (4p)-th stages with the first clock signal CKV1.

The second clock line SL3 receives the second clock signal CKV2 from the external device, and provides first clock terminals CK1 of the second stage SRC2 and the (4p+2)-th stages with the second clock signal CKV2.

Moreover, the second clock line SL3 provides fourth clock terminals CK4 of the third stage SRC3 and (4p+3)-th stages, third clock terminals CK3 of the (4p)-th stages, and second clock terminals CK2 of the first stage SRC1 and the (4p+1)-th stages with the second clock signal CKV2.

The third clock line SL4 receives the third clock signal CKV1B from the external device, and provides first clock terminals CK1 of the third stage SRC3 and the (4p+3)-th stages with the third clock signal CKV1B.

Moreover, the third clock line SL4 provides fourth clock terminals CK3 of the (4p)-th stages, the third clock terminals CK3 of the first stage SRC1 and the (4p+1)-th stages, and second clock terminals CK2 of the second stage SRC2 and the (4p+2)-th stages with the third clock signal CKV1B.

The fourth clock line SL5 receives the fourth clock signal CKV2B from the external device, and provides first clock terminals CK1 of the (4p)-th stages with the fourth clock signal CKV2B.

Moreover, the fourth clock line SL5 provides third clock terminals CK3 of the first stage SRC1 and the (4p+1)-th stages, third clock terminals CK3 of the second stage and the (4p+2)-th stages, and second clock terminals CK2 of the third stage SRC3 and the (4p+3)-th stages with the fourth clock signal CKV2B.

The first power line SL6 receives the ground voltage Vss from the external device, and provides the power terminal V1 of the (m+1) stages with the ground voltage Vss.

The reset line SL7 receives the carry signal provided from the (m+1)-th stage SRC(m+1), and provides the reset terminals RE of the (m+1) stages with the carry signal.

Figure 7:
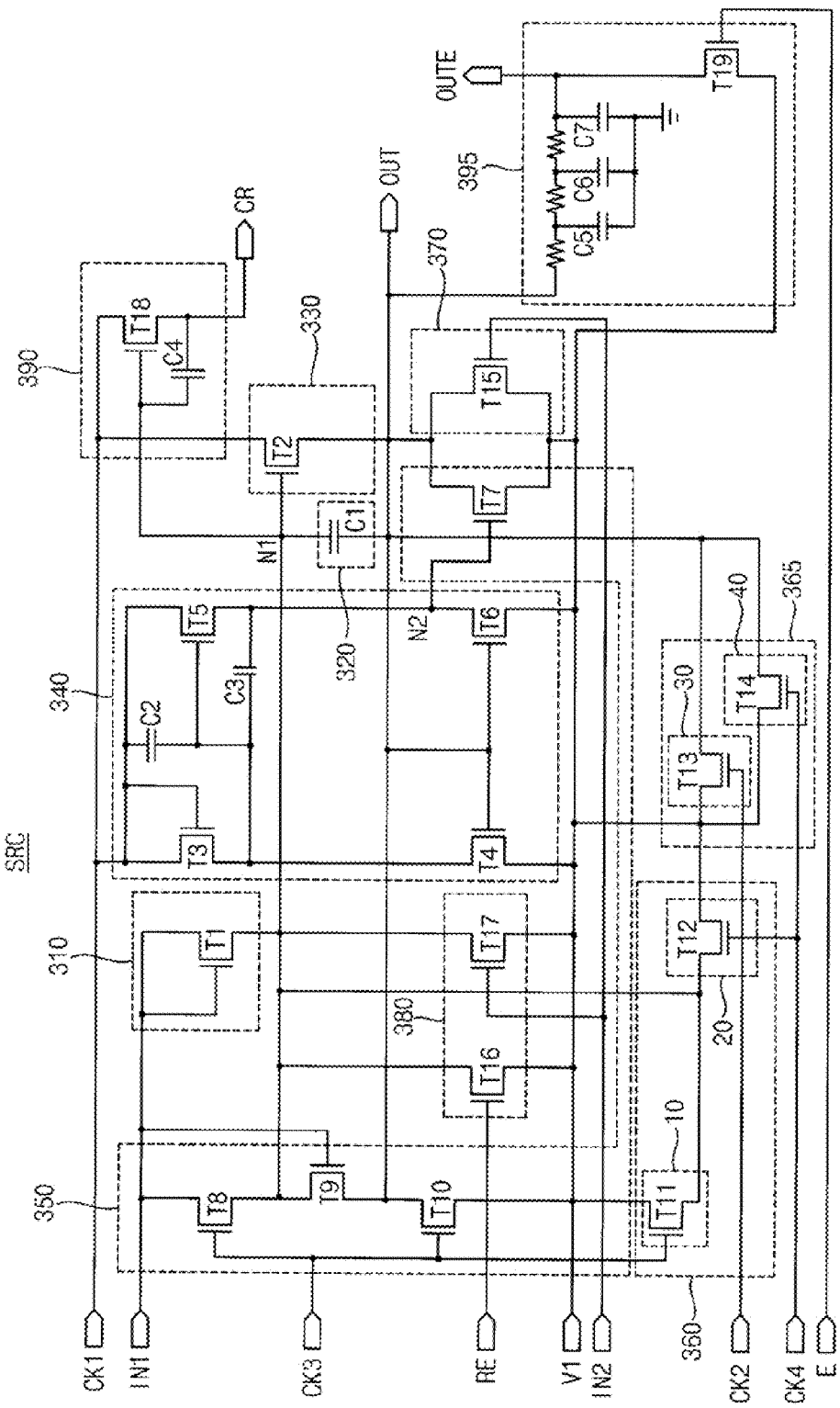
FIG. 7 is a circuit diagram illustrating a stage of FIG. 6.

FIG. 7 is a circuit diagram illustrating a stage of FIG. 6.

Figure 8:
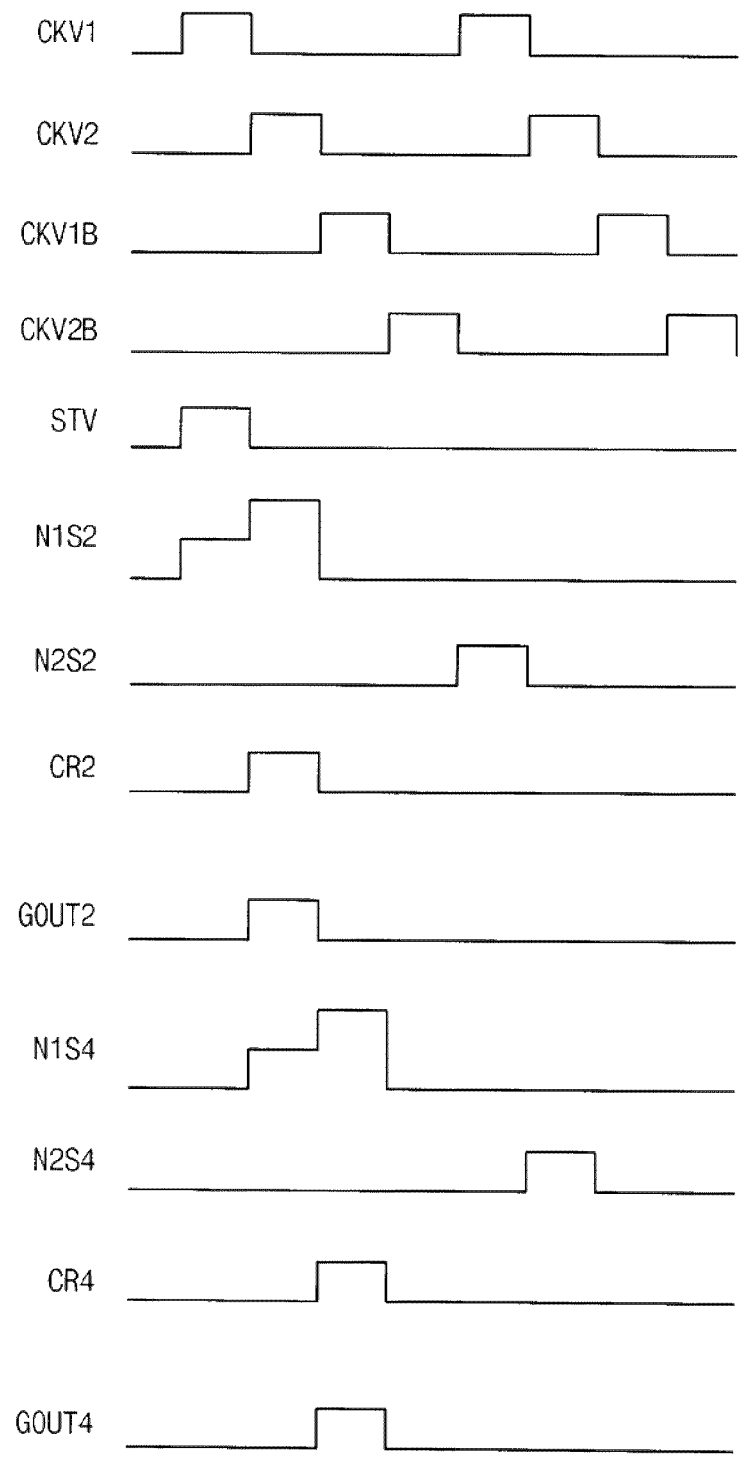
FIG. 8 is a waveform diagram illustrating input/output signals of the gate drive circuit of FIG. 7.

FIG. 8 is a waveform diagram illustrating input/output signals of the gate drive circuit of FIG. 7.

Referring to FIGS. 6 through 8, an m-th stage SRCm of the gate driving part 300 includes a buffer part 310, a charging part 320, a pull-up part 330, a first holding part 340, a second holding part 350, a first node holding part 360, a gate holding part 365, a pull-down part 270, a discharging part 280, a carry part 290 and an enable part 395. Here, an (m−1)-th stage SRC(m−1) is referred to as a "previous stage," and the (m+1)-th stage SRC(m+1) is referred to as a "next stage", where 'm' is a natural number.

A drain (or a first current electrode) and a gate (or a control electrode) of the buffer part 310 that are each connected to the first input terminal IN1 receives a signal of the first input terminal IN1 (hereinafter referred to as first input signal) to provide a first node N1 with a high level signal in accordance with the first input signal. Here, a signal provided to the first node N1 of the m-th stage SRCm is referred to as a "first node signal N1Sm."

A source (or a second current electrode) of the buffer part 310 that is connected to a first end of the charging part 320 includes a first transistor T1 forming the first node N1.

That is, the first transistor T1 is turned on by being synchronized with the vertical start signal STV so that the high level signal is provided to the first node N1 as the first node signal N1Sm. Alternatively, buffer parts 310 of the second to (m+1)-th stages SRC2 to SRC(m+1) receive gate signals of previous stages as the first input signals.

A phase of the vertical start signal STV is synchronized with a signal provided with the first clock terminal CK1, and a pulse width of the vertical start signal STV may be equal to a pulse width of the signal provided with the first clock terminal CK1.

For example, the signal provided with the first clock terminal CK1 may be the first clock signal CKV1, and the vertical start signal STV synchronizes the first clock signal CKV1, in the first stage SRC1.

The first end of the charging part 320 is connected to the source of the first transistor T1 to form the first node N1, and a second end of the charging part 320 charges a first capacitor C1 with a high level provided from the buffer part 310 to maintain the first node N1 at the high level.

The pull-up part 330 includes a second transistor of which a drain is connected to the first clock terminal CK1, a gate is connected to a first end of the first capacitor C1 to form the first node N1, and a source is connected to a second end of the first capacitor C1 and the output terminal.

The pull-up part 330 outputs a gate signal GOUT in a high state through the output terminal OUT based on the first clock signal CKV1, the second clock signal CKV2, the third clock signal CKV1B and the fourth clock signal CKV2B provided from the first clock terminal CK1, in response to the signal of the first node N1.

For example, the first stage SRC1 and the (4p+1)-th stages output the gate signal GOUT based on the first clock signal CKV1.

The second stage SRC2 and the (4p+2)-th stages output the gate signal GOUT based on the second clock signal CKV2.

The third stage SRC3 and the (4p+3)-th stages output the gate signal GOUT based on the third clock signal CKV1B.

The (4p)-th stages output the gate signal GOUT based on the fourth clock signal CKV2B.

According to FIG. 6, the enable terminals of the even stages receive the high level signals so that the gate signals may be output from the even stages.

The first holding part 340 includes a third transistor T3, a fourth transistor T4, a fifth transistor T5, a sixth transistor T6, a second capacitor C2 and a third capacitor C3. When a signal of the first clock signal CKV1 is in a high state and a signal of the first node N1 is in a low stage, the first holding part 340 maintains a second node N2 at the high level. Here, a signal provided to the second node N2 of the m-th stage SRCm is referred to as a "second node signal N2Sm."

A drain and a gate of the third transistor T3 are each connected to the third first terminal CK1, and a source of the third transistor T3 is connected to a drain of the fourth transistor T4.

A gate of the fourth transistor T4 is connected to the first node N1, and a source of the fourth transistor T4 is connected to the power terminal V1.

A drain of the fifth transistor T5 is connected to the first clock terminal CK1, and a gate of the fifth transistor T5 is connected to the source of the third transistor T3 and the drain of the fourth transistor T4.

A drain of the sixth transistor T6 is connected to a source of the fifth transistor T5 to form the second node N2, the gate of the sixth transistor T6 and the gate of the fourth transistor T4 are connected to the first node N1, and a source of the sixth transistor T6 is connected to the power terminal V1.

The second capacitor is connected between the drain and the gate of the fifth transistor T5, and the third capacitor is connected between the gate and the source of the fifth transistor T5.

The first holding part 340 controls the second holding part 350 with the second node signal N2Sm of the second node N2.

For example, a control voltage synchronized with the signal of the first clock terminal CK1 is provided to the second node N2 through the fifth transistor T5. When a signal of the output terminal OUT is high, the sixth transistor T6 is turned on so that the signal of the second node N2 is low.

Therefore, a signal synchronized with the signal of the first clock terminal CK1 is provided to the second node N2 except when the signal of the output terminal OUT is high. When the signal of the output terminal OUT is high, the second node N2 is low.

The second holding part 350, which includes a seventh transistor T7, an eighth transistor T8, a ninth transistor T9 and a tenth transistor T10, maintains the signal of the output terminal OUT at a signal of the power terminal V1 in response to the signal of the third clock terminal CK3, and is turned on by the first holding part 340 to maintain the signal the output terminal OUT at the signal of the power terminal V1.

For example, a drain of the seventh transistor T7 is connected to the output terminal OUT, a gate of the seventh transistor T7 is connected to the first holding part 340 through the second node N2, and a source of the seventh transistor T7 is connected to the power terminal V1.

A drain of the eighth transistor T8 is connected to the first input terminal IN1 to receive the first input signal, a gate of the eighth transistor T8 is connected to the third clock terminal CK3, and a source of the eighth transistor T8 is connected to the first node N1.

A drain of the ninth transistor T9 is connected to the first node N1, a gate of the ninth transistor T9 is connected to the first input terminal CK1, and a source of the ninth transistor T9 is connected to the output terminal OUT.

For example, the eighth transistor T8 provides the first node N1 with a signal from the first input terminal IN1 in response to the signal from the third clock terminal CK3. The ninth transistor T9 provides the first node N1 with the signal of the output terminal OUT in response to the signal from the first clock terminal CK1.

A drain of the tenth transistor T10 is connected to the output terminal OUT, a gate of the drain of the tenth transistor T10 and the gate of the eighth transistor T8 are each connected to the third clock terminal CK3, and a source of the drain of the tenth transistor T10 is connected to the power terminal V1.

For example, the tenth transistor T10 maintains the signal of the output terminal OUT at the signal of the power terminal V1 in response to the signal from the third clock terminal CK3. The seventh transistor T7 is turned on by the first holding part 340 to maintain the signal the output terminal OUT at the signal of the power terminal V1.

Here, the signal of the second clock terminal CK2 may be a signal delayed by about ¼ period of the signal of the first clock terminal CK1. The signal of the third clock terminal CK3 may be a signal delayed by about ¾ period of the signal of the first clock terminal CK1. The signal of the fourth clock terminal CK4 may be a signal delayed by about ½ period of the signal of the first clock terminal CK1.

For example, the second clock signal CKV2 is provided to the first clock terminal CK1 of the second stage SRC2. Thus, the third clock signal CKV1B provided to the second clock terminal CK2 may be the signal delayed by about ¼ period of the second clock signal CKV2. The fourth clock signal CKV2B provided to the third clock terminal CK3 may be the signal delayed by about ½ period of the second clock signal CKV2. The first clock signal CKV1 provided to the fourth clock terminal CK4 may be the signal delayed by about ¾ period of the second clock signal CKV2.

The second holding part 350 causes the output terminal OUT to output the low gate signal GOUT after the pull-down part 370 operates. That is, the second holding part 350 provides the output terminal OUT with the ground voltage Vss in response to when the gate signal GOUT is low. Moreover, the second holding part 350 performs holding of the turned-off second transistor T2 in the pull-up part 330 by providing the first node N1 with the ground voltage Vss.

For example, when the signal of the first clock terminal CK1 is high, the signal of the second node N2 is high so that the seventh transistor T7 is turned on. Thus, the ground voltage Vss is output from the output terminal OUT through the seventh transistor T7. Moreover, the ground voltage Vss is provided to the first node N1 through the ninth transistor T9 so that the second transistor T2 is turned off.

Moreover, when the signal of the first clock terminal CK1 is low, the signal of the third clock terminal CK3 is high so that the ground voltage Vss is output from the output terminal through the tenth transistor T10. Thus, the seventh and tenth transistors T7 and T10 are alternately turned on so that the output terminal OUT outputs the ground voltage Vss.

A drain of the pull-down part 370 includes an eleventh transistor T11 that includes a drain connected to the output terminal OUT, a gate of the pull-down part 260 is connected to the second input terminal IN2 to receive the second input signal, and a source of the pull-down part 370 is connected to the power terminal V1 to receive the ground voltage Vss.

The pull-down part 370 provides the ground voltage Vss to the output terminal OUT in response to a signal of the second input terminal IN2 (hereinafter referred to as second input signal). That is, the pull-down part 370 is turned on to provide the ground voltage Vss to the output terminal OUT when the second input signal is high.

The discharging part 380 a sixteenth transistor T16 and a seventeenth transistor T17, and firstly discharges electric charges from the charging part 320 to the power terminal V1. Moreover, the discharging part 380 secondly discharge electric charges from the charging part 320 to the power terminal V1 in response to a carry signal from the (m+1)-th stage SRC(m+1) that is the last stage.

For example, a drain of the sixteenth transistor T16 is connected to the first node N1, a gate of the sixteenth transistor T16 is connected to the reset terminal RE to receive the carry signal from the (m+1)-th stage SRC(m+1), and a source of the sixteenth transistor T16 is connected to the power terminal V1.

A drain of the seventeenth transistor T17 is connected to the first node N1, a gate of the seventeenth transistor T17 is connected to the second input terminal IN2 to receive the second input signal, and a source of the seventeenth transistor T17 is connected to the second power terminal V2.

The carry part 390 includes a eighteenth transistor T18 and a fourth capacitor C4, and outputs the carry signal to the carry terminal CR based on the signal of the first clock terminal CK1. Here, the carry signal from the carry terminal CR of the m-th stage is referred to as an "m-th carry signal CRm."

A drain of the eighteenth transistor T18 is connected to the first clock terminal CK1, a gate of the eighteenth transistor T18 is connected to the first node N1, and a source of the eighteenth transistor T18 is connected to the carry terminal CR. The fourth capacitor C4 is connected between the gate and source of the eighteenth transistor T18.

Here, the carry part 390 receives the signal of the first clock terminal CK1 that is electrically separated from the output terminal so that a normal carry signal may be output to induce normal operation of the (m+1)-th stage SRC(m+1) that is the next stage following the m-th stage.

The carry holding part 360 includes a first maintaining part 10 and a second maintaining part 20, maintains the first node N1 at the ground voltage Vss in response to the signal from the third clock terminal CK3, maintains the first node N1 at the ground voltage Vss in response to the signal from the fourth clock terminal CK4.

The first maintaining part 10 includes an eleventh transistor T11 and the second maintaining part 20 includes a twelfth transistor T12.

A drain of the eleventh transistor T11 is connected to the power terminal V1, a gate of the eleventh transistor T11 is connected to the third clock terminal CK3, and a source of the eleventh transistor T11 is connected to the first node N1.

A drain of the twelfth transistor T12 is connected to the first node N1, a gate of the twelfth transistor T12 is connected to the second clock terminal CK2, and a source of the twelfth transistor T12 is connected to the power terminal V1.

For example, the eleventh transistor T11 maintains the first node N1 at the signal of the power terminal V1 in response to the signal from the third clock terminal CK3, and the twelfth transistor T12 maintains the first node N1 at the signal of the power terminal V1 in response to the signal from the second clock terminal CK2.

Therefore, a stable circuit may be realized because the first node N1 may stably receive the ground voltage Vss during the ¾ period of the signal of the second clock terminal CK2. That is, when the first node N1 does not receive a high level signal the first node N1 may receive the ground voltage Vss.

The gate holding part 365 includes a third maintaining part 30 and a fourth maintaining part 40, maintains the output terminal OUT at the ground voltage Vss in response to the signal from the second clock terminal CK2, maintains the output terminal OUT at the ground voltage Vss in response to the signal from the fourth clock terminal CK4.

The third maintaining part 30 includes a thirteenth transistor T13 and the fourth maintaining part 40 includes a fourteenth transistor T14.

A drain of the thirteenth transistor T13 is connected to the power terminal V1, a gate of the thirteenth transistor T13 is connected to the second clock terminal CK2, and a source of the thirteenth transistor T13 is connected to the first node N1.

A drain of the fourteenth transistor T14 is connected to the power terminal V1, a gate of the fourteenth transistor T14 is connected to the fourth clock terminal CK4, and a source of the fourteenth transistor T14 is connected to the output terminal OUT.

For example, the thirteenth transistor T13 maintains the output terminal OUT at the signal of the power terminal V1 in response to the signal from the second clock terminal CK2, and the fourteenth transistor T14 maintains the output terminal OUT at the signal of the power terminal V1 in response to the signal from the fourth clock terminal CK4.

Therefore, a stable circuit may be realized because the output terminal OUT may stably receive the ground voltage Vss during a period in which a period of the signal of the second clock terminal CK2.

The enable part 395 includes a nineteenth transistor T19, a first resistor R1, a second resistor R2, a third resistor R3, a fifth capacitor C5, a sixth capacitor C6 and a seventh capacitor C7, and maintains an output of an m-th stage that is a present stage at a low level when a signal of an output enable terminal OUTE of the next stage is high.

The first to third resistors R1 to R3 are serially disposed between the output terminal OUT and the output enable terminal OUTE. A first end of the fifth capacitor C5 is connected between the first and second resistors R1 and R2, and a second end of the fifth capacitor C5 is grounded. A first end of the sixth capacitor C6 is connected between the third resistor R3 and the output enable terminal OUTE, a second end of the sixth capacitor C6 is grounded.

A drain of the nineteenth transistor T19 is connected to the output enable terminal OUTE, a gate of the nineteenth transistor T19 is connected to the output enable terminal OUTE, and a source of the nineteenth transistor T19 is connected to the power terminal V1.

For example, an output of an output enable terminal OUTE of the (m+1)-th stage SRC(m+1) that is the next stage following the m-th stage is high, an output of the output terminal OUT is low because a low level signal is provided to an enable terminal E of the present stage.

Moreover, the output of the output enable terminal OUTE of the (m+1)-th stage SRC(m+1) that is the next stage following the m-th stage is low, the output of the output terminal OUT is normally output because a high level signal is provided to the enable terminal E of the present stage.

Figure 9A:
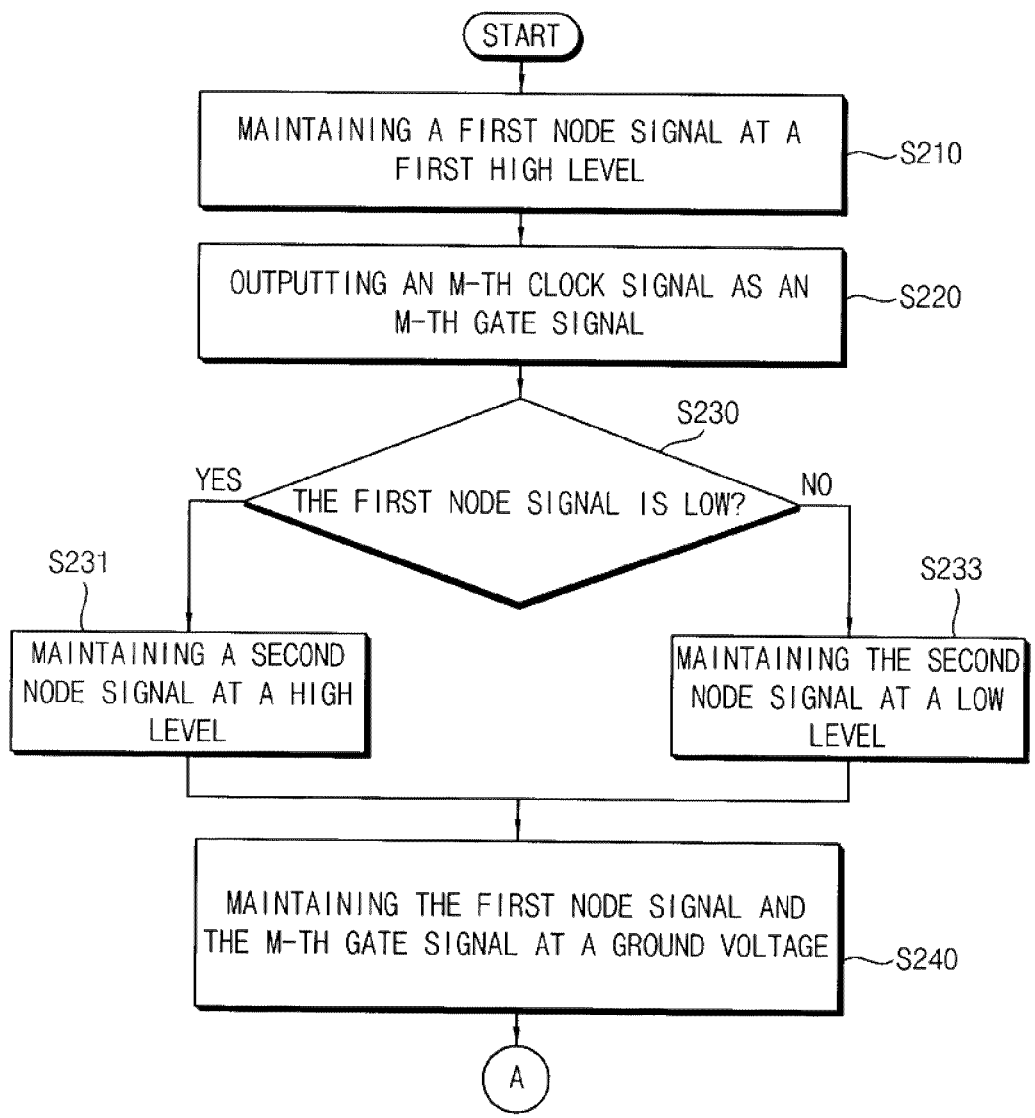
FIGS. 9A and 9B are flowcharts illustrating a method of driving the gate drive circuit of FIG. 6.
Figure 9B:
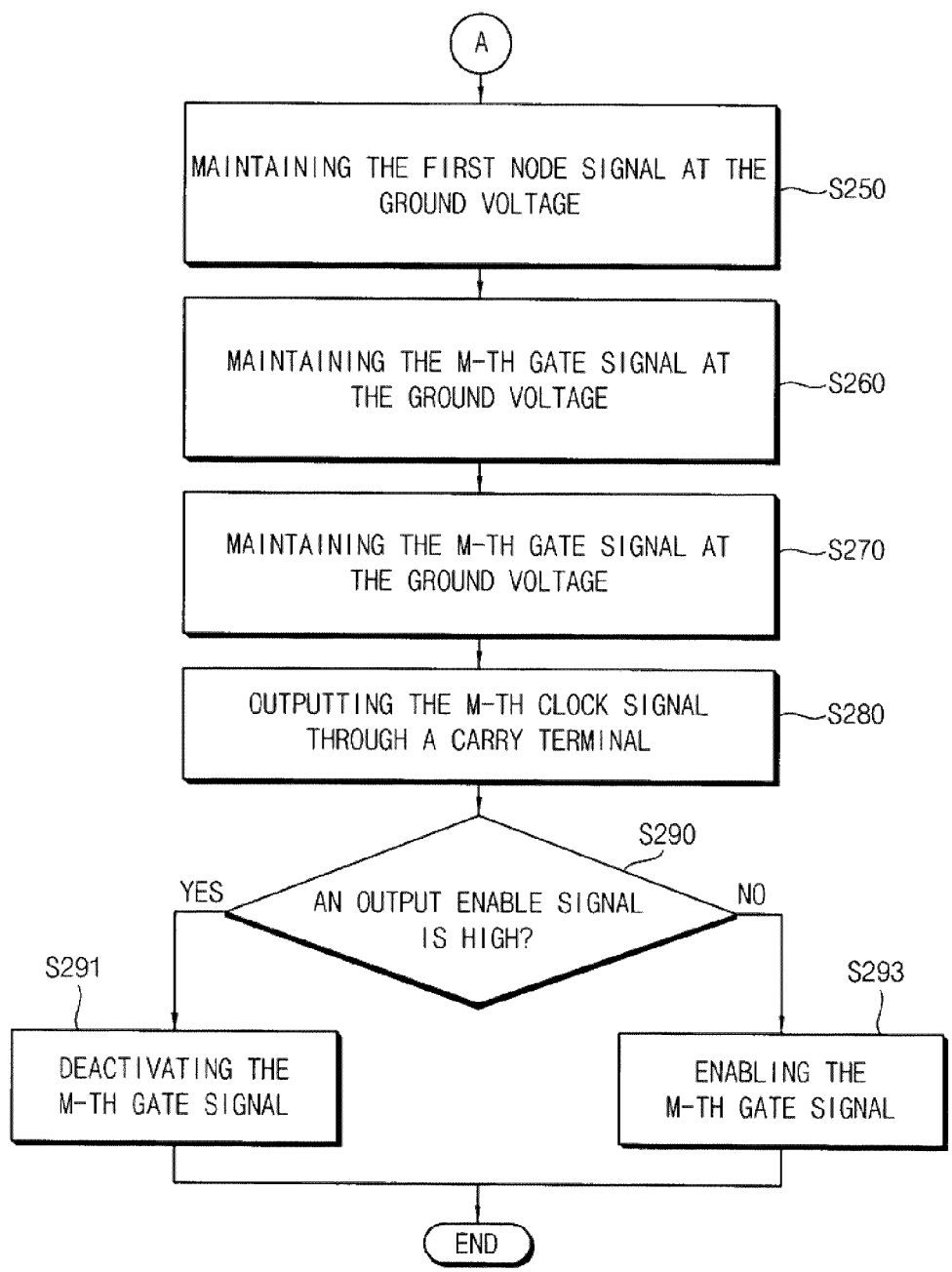

FIGS. 9A and 9B are flowcharts illustrating a method of driving the gate drive circuit of FIG. 6.

Referring to FIGS. 6 through 9B, a method of activating an m-th gate line follows.

The buffer part 310 maintains the first node signal N1Sm that is the signal of the first node N1 at the first high level based on an (m−1)-th carry signal from the carry terminal CR or the vertical start signal STV (block S210).

Here, m-th clock signal is provided to the first node N1 so that the charging part 220 may charge electric charges. Thus, the first node signal N1Sm may be maintained at the first high level.

The pull-up part 330 outputs the m-th clock signal through the output terminal OUT as an m-th gate signal that is provided to the m-th gate line in response to the first node signal N1Sm (block S220). Here, the m-th gate clock signal may be the first clock signal CKV1, the second clock signal CKV2, the third clock signal CKV1B and the fourth clock signal CKV2B. Moreover, the first node signal N1Sm may be boosted up to the second high level higher than the first high level when the m-th gate signal is output.

The first holding part 340 determines whether or not the first node signal N1Sm is low during a period in which the m-th clock signal is high (block S230).

When, the first node signal N1Sm is low, the second node signal N2Sm is maintained at the high level (block S231). In contrast, when the first node signal N1Sm is high, the second node signal N2Sm is maintained at the low level (block S233).

In other words, during a period in which the (m+3)-th clock signal that is the signal delayed by about ¾ period of the m-th clock signal is high and the first node signal N1Sm is high, the first holding part 340 maintains the second node signal N2Sm at the high level.

That is, during a period in which the first node signal N1Sm is high, that is, during a period in which the m-th gate clock signal is output through the output terminal OUT as the m-th gate signal, the output terminal OUT is substantially prevented from outputting the ground voltage. Thus, except when the first node signal N1Sm is high, that is, the m-th clock signal is high, the output terminal OUT outputs the ground voltage Vss.

Then, the second holding part 350 maintains the first node signal N1Sm at the ground voltage Vss and outputs the ground voltage Vss as the m-th gate signal in response to the second node signal N2Sm and an (m+2)-th clock signal that is a signal delayed by about ½ period of the m-th clock signal (block S240).

Accordingly, except when the m-th clock signal is output through the output terminal OUT, that is, the m-th clock signal is high, the first holding part 340 maintains the first node signal N1Sm at the ground voltage Vss and outputs the ground voltage Vss as the m-th gate signal.

Moreover, during a period in which the (m+2)-th clock signal is high, the second holding part 350 maintains the first node signal N1Sm at the ground voltage Vss and outputs the ground voltage Vss as the m-th gate signal.

Here, the m-th clock signal has a phase opposite to the (m+2)-th clock signal, so that the first node N1 may stably receive the ground voltage Vss during a period in which the first node N1 does not receive a high level signal.

The first node holding part 360 maintains the first node signal N1Sm at the ground voltage Vss in response to a signal delayed by about ¼ period of the m-th clock signal, and maintains the first node signal N1Sm at the ground voltage Vss in response to the (m+2)-th clock signal (block S250).

The gate holding part 365 maintains the m-th gate signal at the ground voltage Vss in response to an (m+1)-th clock signal, and maintains the m-th gate signal at the ground voltage Vss in response to the (m+3)-th clock signal that is a signal delayed by about ¾ period of the m-th clock signal (block S260).

Then, the pull-down part 370 outputs the ground voltage Vss as the m-th gate signal in response to an (m+1) gate signal or the vertical start signal STV (block S270).

The discharging part 390 firstly discharges electric charges from the charging part 320 to the power terminal V1 in response to the (m+1)-th clock signal. Moreover, the discharging part 390 secondly discharge electric charges from the charging part 320 to the power terminal V1 in response to a carry signal from the (m+1)-th stage SRC(m+1) that is the last stage.

The carry part 390 outputs the m-th clock signal through the carry terminal CR in response to the first node signal N1Sm (block S280).

The enable part 395 determines whether or not an output enable signal that enables the (m+1)-th gate signal is high (block S290).

When, the output enable signal is high, the carry part 390 deactivates the m-th gate signal that is an output of the m-th stage (block S291). In contrast, when the output enable signal is low, the carry part 390 enables the m-th gate signal that is the output of the m-th stage (block S293).

As described above, according to embodiments of the present invention, a first node may stably receive a ground voltage during a period in which the first node does not receive a high level signal. Moreover, a turn-on signal may be provided to a first gate drive circuit without delays. Thus, the reliability of a gate signal provided from the gate drive circuit may be enhanced.

The foregoing is illustrative of the present invention and is not to be construed as limiting thereof. Although exemplary embodiments of the present invention have been described, those skilled in the art will readily appreciate that many modifications are possible without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to exemplary embodiments disclosed, and that modifications to exemplary embodiments, as well as other embodiments, are intended to be included within the scope of the appended claims. The present invention is defined by the following claims, with equivalents of the claims to be included therein.

What is claimed is:

1. A gate drive circuit in which a plurality of stages are connected in series to each other, the gate drive circuit sequentially activating a plurality of gate lines, a present stage comprising:

a pull-up driving part maintaining a signal of a first node at a high level by receiving a turn-on voltage in response to one of a previous stage in the series or a vertical start signal;

a pull-up part outputting a clock signal of a first clock terminal through an output terminal in response to the signal of the first node;

a first holding part maintaining a signal of a second node at a high level in response to a low level of the signal of the first node and maintaining the signal of the second node at a low level in response to a high level of the signal of the first node, during a period in which a delayed signal of the clock signal is high; and a second holding part maintaining the signal of the first node and a signal of the output terminal at a ground voltage in response to the signal of the second node or an inverted signal of the delayed signal of the clock signal, wherein the first holding part comprises:
a first transistor comprising a drain and a gate, each of the drain and the gate connected to a third clock terminal to receive a delayed first clock signal;
a second transistor comprising a drain connected to a source of the first transistor, a gate connected to the first node, and a source receiving the ground voltage;
a third transistor comprising a drain connected to the third clock terminal, and a gate connected to a source of the first transistor;
a fourth transistor comprising a drain connected to a source of the third transistor forming the second node, and a gate connected to the gate of the second transistor and connected to the first node, and a source receiving the ground voltage;
a first capacitor being connected between the drain of the third transistor and the gate of the third transistor; and
a second capacitor being connected between the gate of the third transistor and the source of the third transistor.

2. The gate drive circuit of claim 1, further comprising:
a pull-down part outputting the ground voltage through the output terminal in response to one of a next stage in the series, or the vertical start signal.

3. The gate drive circuit of claim 1, wherein the pull-up driving part comprises:
a buffer part receiving the turn-on voltage to provide the first node with a first high level signal in response to the one of the previous stage or the vertical start signal; and
a charging part boosting the first high level signal to a second high level signal in synchronization with the signal of the output terminal.

4. The gate drive circuit of claim 1, wherein the fourth transistor maintains the signal of the second node at a low level when the signal of the first node is high, during a period in which a signal of the third clock terminal is high.

5. The gate drive circuit of claim 1, wherein the second holding part comprises:
a fifth transistor comprising a drain connected to the first node, a gate connected to the second node, and a source receiving the ground voltage;
a sixth transistor comprising a drain connected to the output terminal, a gate connected to the second node, and a source receiving the ground voltage;
a seventh transistor comprising a drain connected to a first input terminal, a gate connected to a second clock terminal to receive the inverted signal of the delayed signal of the clock signal, and a source connected to the first node; and
an eighth transistor comprising a drain connected to the output terminal, a gate connected to the gate of the seventh transistor and connected to the second clock terminal, and a source receiving the ground voltage.

6. The gate drive circuit of claim 5, wherein the fifth transistor maintains the signal of the first node at the ground voltage in response to the signal of the second node, during a period in which a signal of the third clock terminal is high.

7. The gate drive circuit of claim 5, wherein the sixth transistor maintains a signal of the output terminal at the ground voltage in response to the signal of the second node during a period in which a signal of the third clock terminal is high.

8. The gate drive circuit of claim 5, wherein the seventh transistor maintains the signal of the first node at the ground voltage in response to the signal of the second clock terminal, during a period in which a signal of the second clock terminal of which a phase is opposite to a phase of a signal of the third clock terminal is high.

9. The gate drive circuit of claim 5, wherein the eighth transistor maintains the signal of the output terminal at the ground voltage in response to the signal of the second clock terminal, during a period in which a signal of the second clock terminal is high.

10. The gate drive circuit of claim 5, wherein the present stage further comprises:
a carry part outputting a signal of the first clock terminal through a carry terminal as a carry signal in response to the signal of the first node; and
a carry holding part outputting the ground voltage through the carry terminal as the carry signal in response to a signal of the second clock terminal.

11. The gate drive circuit of claim 5, wherein a phase of the vertical start signal is synchronized with a phase of a signal of the third clock terminal, and a pulse width of the vertical start signal is substantially half of a pulse width of the signal of the third clock terminal.

12. A gate drive circuit in which a plurality of stages are connected in series to each other, the gate drive circuit sequentially activating a plurality of gate lines, a present stage comprising:
a pull-up driving part maintaining a signal of a first node at a high level by receiving a turn-on voltage in response to one of a previous stage in the series or a vertical start signal;
a pull-up part outputting a clock signal of a first clock terminal through an output terminal in response to the signal of the first node;
a first holding part maintaining a signal of a second node at a high level in response to a low level of the signal of the first node and maintaining the signal of the second node at a low level in response to a high level of the signal of the first node, during a period in which a delayed signal of the clock signal is high; and
a second holding part maintaining the signal of the first node and a signal of the output terminal at a ground voltage in response to the signal of the second node or an inverted signal of the delayed signal of the clock signal,
wherein the second holding part comprises:
a first transistor comprising a drain connected to the first node, a gate connected to the second node, and a source receiving the ground voltage;
a second transistor comprising a drain connected to the output terminal, a gate connected to the second node, and a source receiving the ground voltage;
a third transistor comprising a drain connected to a first input terminal, a gate connected to a second clock terminal to receive the inverted signal of the delayed signal of the clock signal, and a source connected to the first node; and
an fourth transistor comprising a drain connected to the output terminal, a gate connected to the gate of the third transistor and connected to the second clock terminal, and a source receiving the ground voltage.

13. The gate drive circuit of claim 12, further comprising:
a pull-down part outputting the ground voltage through the output terminal in response to one of a next stage in the series, or the vertical start signal.

14. The gate drive circuit of claim 12, wherein the pull-up driving part comprises:
a buffer part receiving the turn-on voltage to provide the first node with a first high level signal in response to the one of the previous stage or the vertical start signal; and a charging part boosting the first high level signal to a second high level signal in synchronization with the signal of the output terminal.

15. The gate drive circuit of claim 12, wherein the first holding part comprises:
   a fifth transistor comprising a drain and a gate, each of the drain and the gate connected to a third clock terminal to receive a delayed first clock signal;
   a sixth transistor comprising a drain connected to a source of the fifth transistor, a gate connected to the first node, and a source receiving the ground voltage;
   a seventh transistor comprising a drain connected to the third clock terminal, and a gate connected to a source of the fifth transistor;
   a eighth transistor comprising a drain connected to a source of the seventh transistor forming the second node, and a gate connected to the gate of the sixth transistor and connected to the first node, and a source receiving the ground voltage;
   a first capacitor being connected between the drain of the seventh transistor and the gate of the seventh transistor; and
   a second capacitor being connected between the gate of the seventh transistor and the source of the seventh transistor.

16. The gate drive circuit of claim 15, wherein the eighth transistor maintains the signal of the second node at a low level when the signal of the first node is high, during a period in which a signal of the third clock terminal is high.

17. The gate drive circuit of claim 12, wherein the first transistor maintains the signal of the first node at the ground voltage in response to the signal of the second node, during a period in which a signal of the third clock terminal is high.

18. The gate drive circuit of claim 12, wherein the second transistor maintains a signal of the output terminal at the ground voltage in response to the signal of the second node during a period in which a signal of the third clock terminal is high.

19. The gate drive circuit of claim 12, wherein the third transistor maintains the signal of the first node at the ground voltage in response to the signal of the second clock terminal, during a period in which a signal of the second clock terminal of which a phase is opposite to a phase of a signal of the third clock terminal is high.

20. The gate drive circuit of claim 12, wherein the fourth transistor maintains the signal of the output terminal at the ground voltage in response to the signal of the second clock terminal, during a period in which a signal of the second clock terminal is high.

21. The gate drive circuit of claim 12, wherein the present stage further comprises:
   a carry part outputting a signal of the first clock terminal through a carry terminal as a carry signal in response to the signal of the first node; and
   a carry holding part outputting the ground voltage through the carry terminal as the carry signal in response to a signal of the second clock terminal.

22. The gate drive circuit of claim 12, wherein a phase of the vertical start signal is synchronized with a phase of a signal of the third clock terminal, and a pulse width of the vertical start signal is substantially half of a pulse width of the signal of the third clock terminal.

* * * * *